United States Patent
Hush

(10) Patent No.: US 10,529,387 B2
(45) Date of Patent: *Jan. 7, 2020

(54) APPARATUSES AND METHODS FOR PERFORMING LOGICAL OPERATIONS USING SENSING CIRCUITRY

(71) Applicant: Micron Technology, Inc., Boise, ID (US)

(72) Inventor: Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/111,085

(22) Filed: Aug. 23, 2018

(65) Prior Publication Data

US 2018/0366165 A1 Dec. 20, 2018

Related U.S. Application Data

(63) Continuation of application No. 15/685,643, filed on Aug. 24, 2017, now Pat. No. 10,074,406, which is a
(Continued)

(51) Int. Cl.
*G11C 7/06* (2006.01)
*G11C 7/10* (2006.01)
(Continued)

(52) U.S. Cl.
CPC ............ *G11C 7/065* (2013.01); *G11C 7/1006* (2013.01); *G11C 11/4091* (2013.01); *G11C 7/12* (2013.01);
(Continued)

(58) Field of Classification Search
CPC ......... G11C 7/065; G11C 7/1006; G11C 7/12; G11C 11/4091; G11C 11/4094; G11C 2207/005
(Continued)

(56) References Cited

U.S. PATENT DOCUMENTS 4,380,046 A 4/1983 Fung
4,402,043 A * 8/1983 Guttag ................... G06F 9/223
365/200
(Continued)

FOREIGN PATENT DOCUMENTS

CN 102141905 8/2011
EP 0214718 3/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Sung Il Cho
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry coupled to the array. The sensing circuitry can include a sense amplifier coupled to a pair of complementary sense lines and a compute component coupled to the sense amplifier via pass gates coupled to logical operation selection logic. The logical operation selection logic can be configured to control pass gates based on a selected logical operation.

19 Claims, 18 Drawing Sheets

Related U.S. Application Data continuation of application No. 14/921,509, filed on Oct. 23, 2015, now Pat. No. 9,779,784.

(60) Provisional application No. 62/069,944, filed on Oct. 29, 2014.

(51) Int. Cl.
  *G11C 11/4091* (2006.01)
  *G11C 7/12* (2006.01)
  *G11C 11/4094* (2006.01)

(52) U.S. Cl.
  CPC .... *G11C 11/4094* (2013.01); *G11C 2207/005* (2013.01)

(58) Field of Classification Search
  USPC .......................................................... 365/205
  See application file for complete search history.

(56) References Cited

U.S. PATENT DOCUMENTS

| | | | |
|---|---|---|---|
| 4,422,143 | A * | 12/1983 | Guttag ................. G06F 7/503 708/201 |
| 4,435,792 | A | 3/1984 | Bechtolsheim |
| 4,435,793 | A | 3/1984 | Ochii |
| 4,445,204 | A | 4/1984 | Nishiguchi |
| 4,727,474 | A | 2/1988 | Batcher |
| 4,777,591 | A * | 10/1988 | Chang ................. G06F 13/128 710/119 |
| 4,780,853 | A | 10/1988 | Yamada |
| 4,843,264 | A | 6/1989 | Galbraith |
| 4,958,378 | A | 9/1990 | Bell |
| 4,977,542 | A | 12/1990 | Matsuda et al. |
| 5,023,838 | A | 6/1991 | Herbert |
| 5,034,636 | A | 7/1991 | Reis et al. |
| 5,201,039 | A | 4/1993 | Sakamura |
| 5,210,850 | A | 5/1993 | Kelly et al. |
| 5,222,047 | A | 6/1993 | Matsuda et al. |
| 5,253,197 | A | 10/1993 | Suzuki et al. |
| 5,253,308 | A | 10/1993 | Johnson |
| 5,276,643 | A | 1/1994 | Hoffmann et al. |
| 5,289,413 | A * | 2/1994 | Tsuchida .............. G11C 7/1033 365/189.02 |
| 5,325,519 | A | 6/1994 | Long et al. |
| 5,367,488 | A | 11/1994 | An |
| 5,379,257 | A | 1/1995 | Matsumura et al. |
| 5,386,379 | A | 1/1995 | Ali-Yahia et al. |
| 5,398,213 | A | 3/1995 | Yeon et al. |
| 5,440,482 | A | 8/1995 | Davis |
| 5,446,690 | A | 8/1995 | Tanaka et al. |
| 5,473,576 | A | 12/1995 | Matsui |
| 5,481,500 | A | 1/1996 | Reohr et al. |
| 5,485,373 | A | 1/1996 | Davis et al. |
| 5,504,919 | A * | 4/1996 | Lee ........................ G06F 7/24 |
| 5,506,811 | A | 4/1996 | McLaury |
| 5,615,404 | A | 3/1997 | Knoll et al. |
| 5,638,128 | A | 6/1997 | Hoogenboom |
| 5,638,317 | A | 6/1997 | Tran |
| 5,654,936 | A | 8/1997 | Cho |
| 5,678,021 | A | 10/1997 | Pawate et al. |
| 5,724,291 | A | 3/1998 | Matano |
| 5,724,366 | A | 3/1998 | Furutani |
| 5,751,987 | A | 5/1998 | Mahant-Shetti et al. |
| 5,787,458 | A | 7/1998 | Miwa |
| 5,854,636 | A | 12/1998 | Watanabe et al. |
| 5,867,429 | A | 2/1999 | Chen et al. |
| 5,870,504 | A | 2/1999 | Nemoto et al. |
| 5,889,413 | A * | 3/1999 | Bauer ..................... G11C 19/00 326/40 |
| 5,915,084 | A | 6/1999 | Wendell |
| 5,935,263 | A | 8/1999 | Keeth et al. |
| 5,986,942 | A | 11/1999 | Sugibayashi |
| 5,991,209 | A | 11/1999 | Chow |
| 5,991,785 | A | 11/1999 | Alidina et al. |
| 6,005,799 | A | 12/1999 | Rao |
| 6,009,020 | A | 12/1999 | Nagata |
| 6,091,625 | A | 7/2000 | Braun et al. |
| 6,092,186 | A | 7/2000 | Betker et al. |
| 6,122,211 | A | 9/2000 | Morgan et al. |
| 6,125,071 | A | 9/2000 | Kohno et al. |
| 6,134,164 | A | 10/2000 | Lattimore et al. |
| 6,147,514 | A | 11/2000 | Shiratake |
| 6,151,244 | A | 11/2000 | Fujino et al. |
| 6,157,578 | A | 12/2000 | Brady |
| 6,163,862 | A | 12/2000 | Adams et al. |
| 6,166,942 | A | 12/2000 | Vo et al. |
| 6,166,990 | A * | 12/2000 | Ooishi .................. G11C 7/22 365/194 |
| 6,172,918 | B1 | 1/2001 | Hidaka |
| 6,175,514 | B1 | 1/2001 | Henderson |
| 6,181,698 | B1 | 1/2001 | Hariguchi |
| 6,208,544 | B1 | 3/2001 | Beadle et al. |
| 6,226,215 | B1 | 5/2001 | Yoon |
| 6,243,309 | B1 | 6/2001 | Shin |
| 6,301,153 | B1 | 10/2001 | Takeuchi et al. |
| 6,301,164 | B1 | 10/2001 | Manning et al. |
| 6,304,477 | B1 | 10/2001 | Naji |
| 6,310,596 | B1 * | 10/2001 | Takasugi .............. G09G 3/3644 345/98 |
| 6,324,087 | B1 | 11/2001 | Pereira |
| 6,389,507 | B1 | 5/2002 | Sherman |
| 6,418,498 | B1 | 7/2002 | Martwick |
| 6,466,499 | B1 | 10/2002 | Blodgett |
| 6,466,509 | B1 | 10/2002 | Tanizaki et al. |
| 6,510,098 | B1 | 1/2003 | Taylor |
| 6,563,754 | B1 | 5/2003 | Lien et al. |
| 6,578,058 | B1 | 6/2003 | Nygaard |
| 6,731,542 | B1 | 5/2004 | Le et al. |
| 6,754,746 | B1 | 6/2004 | Leung et al. |
| 6,768,679 | B1 | 7/2004 | Le et al. |
| 6,807,614 | B2 | 10/2004 | Chung |
| 6,816,422 | B2 | 11/2004 | Hamade et al. |
| 6,819,612 | B1 | 11/2004 | Achter |
| 6,894,549 | B2 | 5/2005 | Eliason |
| 6,943,579 | B1 | 9/2005 | Hazanchuk et al. |
| 6,948,056 | B1 | 9/2005 | Roth et al. |
| 6,950,771 | B1 | 9/2005 | Fan et al. |
| 6,950,898 | B2 | 9/2005 | Merritt et al. |
| 6,956,770 | B2 | 10/2005 | Khalid et al. |
| 6,961,272 | B2 | 11/2005 | Schreck |
| 6,965,648 | B1 | 11/2005 | Smith et al. |
| 6,985,394 | B2 | 1/2006 | Kim |
| 6,987,693 | B2 | 1/2006 | Cernea et al. |
| 7,020,017 | B2 | 3/2006 | Chen et al. |
| 7,028,170 | B2 | 4/2006 | Saulsbury |
| 7,045,834 | B2 | 5/2006 | Tran et al. |
| 7,054,178 | B1 | 5/2006 | Shiah et al. |
| 7,061,817 | B2 | 6/2006 | Raad et al. |
| 7,079,407 | B1 | 7/2006 | Dimitrelis |
| 7,173,857 | B2 | 2/2007 | Kato et al. |
| 7,187,585 | B2 | 3/2007 | Li et al. |
| 7,196,928 | B2 | 3/2007 | Chen |
| 7,260,565 | B2 | 8/2007 | Lee et al. |
| 7,260,672 | B2 | 8/2007 | Garney |
| 7,372,715 | B2 | 5/2008 | Han |
| 7,400,532 | B2 | 7/2008 | Aritome |
| 7,406,494 | B2 | 7/2008 | Magee |
| 7,447,720 | B2 | 11/2008 | Beaumont |
| 7,454,451 | B2 | 11/2008 | Beaumont |
| 7,457,181 | B2 | 11/2008 | Lee et al. |
| 7,463,501 | B2 | 12/2008 | Dosaka |
| 7,535,769 | B2 | 5/2009 | Cernea |
| 7,546,438 | B2 | 6/2009 | Chung |
| 7,562,198 | B2 | 7/2009 | Noda et al. |
| 7,574,466 | B2 | 8/2009 | Beaumont |
| 7,586,793 | B2 | 9/2009 | Cernea |
| 7,602,647 | B2 | 10/2009 | Li et al. |
| 7,663,928 | B2 | 2/2010 | Tsai et al. |
| 7,685,365 | B2 | 3/2010 | Rajwar et al. |
| 7,692,466 | B2 | 4/2010 | Ahmadi |
| 7,752,417 | B2 | 7/2010 | Manczak et al. |
| 7,791,962 | B2 | 9/2010 | Noda et al. |
| 7,796,453 | B2 | 9/2010 | Riho et al. |

(56) References Cited

U.S. PATENT DOCUMENTS

| | | |
|---|---|---|
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0206608 A1* | 11/2003 | Kawahata ............ G11C 19/00 377/64 |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0221098 A1 | 11/2004 | Ito et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0141387 A1* | 6/2005 | Cernea ................ G11C 7/1036 369/100 |
| 2005/0237798 A1 | 10/2005 | Urabe et al. |
| 2006/0047937 A1 | 3/2006 | Selvaggi et al. |
| 2006/0069849 A1 | 3/2006 | Rudelic |
| 2006/0143428 A1 | 6/2006 | Noda et al. |
| 2006/0146623 A1 | 7/2006 | Mizuno et al. |
| 2006/0149804 A1 | 7/2006 | Luick et al. |
| 2006/0170643 A1* | 8/2006 | Katayama ............ G09G 3/3677 345/100 |
| 2006/0181917 A1 | 8/2006 | Kang et al. |
| 2006/0187718 A1* | 8/2006 | Katayama ............ G11C 19/28 365/188 |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0014181 A1 | 1/2007 | Lee et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0248204 A1* | 10/2007 | Tobita ................ G11C 19/28 377/64 |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037309 A1 | 2/2008 | Makino |
| 2008/0037333 A1 | 2/2008 | Kim et al. |
| 2008/0052711 A1 | 2/2008 | Forin et al. |
| 2008/0094871 A1* | 4/2008 | Parkinson ............ G11C 7/1006 365/100 |
| 2008/0137388 A1 | 6/2008 | Krishnan et al. |
| 2008/0158978 A1* | 7/2008 | Nishiyama ............ G11C 7/065 365/185.18 |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0219401 A1* | 9/2008 | Tobita ................ G09G 3/3677 377/79 |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2009/0303767 A1 | 12/2009 | Akerib et al. |
| 2010/0067296 A1 | 3/2010 | Li |
| 2010/0091582 A1 | 4/2010 | Vali et al. |
| 2010/0164972 A1 | 7/2010 | Akerib et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0329069 A1 | 12/2010 | Ito et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |

(56) References Cited

U.S. PATENT DOCUMENTS

| | | |
|---|---|---|
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0201745 A1 | 8/2013 | Chung |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0146627 A1 | 5/2014 | Cho et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0344934 A1 | 11/2014 | Jorgensen |
| 2015/0063013 A1 | 3/2015 | Iizuka |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

DEBNATH, BIPLOB, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and apparatus for pattern matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Office Action for related Taiwan Patent Application No. 104135647, dated Nov. 11, 2016, 8 pages.

\* cited by examiner

Fig. 7

RESULT IN ACCUM -- (AFTER SENSE AMP FIRE)

| A | B | FS4, FS3, FS2, FS1 | | | | | | | | | | | | | | | |
|---|---|---|---|---|---|---|---|---|---|---|---|---|---|---|---|---|---|
| | | 0000 | 0001 | 0010 | 0011 | 0100 | 0101 | 0110 | 0111 | 1000 | 1001 | 1010 | 1011 | 1100 | 1101 | 1110 | 1111 |
| | | A | A*B | A+B | B | A*B̄ | N/A | AXB | N/A | A+B̄ | ĀXB | N/A | N/A | B̄ | N/A | N/A | N/A |
| 0 | 0 | 0 | 0 | 0 | 0 | 0 | X | 0 | X | 1 | 1 | X | X | 1 | X | X | X |
| 0 | 1 | 0 | 0 | 1 | 1 | 0 | X | 1 | X | 0 | 0 | X | X | 0 | X | X | X |
| 1 | 0 | 1 | 0 | 1 | 0 | 1 | X | 1 | X | 1 | 0 | X | X | 1 | X | X | X |
| 1 | 1 | 1 | 1 | 1 | 1 | 0 | X | 0 | X | 1 | 1 | X | X | 0 | X | X | X |

Fig. 8

RESULT IN SENSE AMP -- (BEFORE SENSE AMP FIRE)

| A | B | FS4, FS3, FS2, FS1 | | | | | | | | | | | | | | | |
|---|---|---|---|---|---|---|---|---|---|---|---|---|---|---|---|---|---|
| | | 0000 | 0001 | 0010 | 0011 | 0100 | 0101 | 0110 | 0111 | 1000 | 1001 | 1010 | 1011 | 1100 | 1101 | 1110 | 1111 |
| | | B | A+B | A*B | A | Ā*B | N/A | RESET | N/A | Ā+B | SET | N/A | N/A | Ā | N/A | N/A | N/A |
| 0 | 0 | 0 | 0 | 0 | 0 | 0 | X | 0 | X | 1 | 1 | X | X | 1 | X | X | X |
| 0 | 1 | 1 | 1 | 0 | 0 | 1 | X | 0 | X | 1 | 1 | X | X | 1 | X | X | X |
| 1 | 0 | 0 | 1 | 0 | 1 | 0 | X | 0 | X | 0 | 1 | X | X | 0 | X | X | X |
| 1 | 1 | 1 | 1 | 1 | 1 | 0 | X | 0 | X | 1 | 1 | X | X | 0 | X | X | X |

TABLE 13-1

| | | 1344 | 1345 | 1356 | 1370 | 1371 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |

1375

| | | 1 | 0 | 1 | 0 | 1 |
| | | 1 | 1 | 1 | 1 | 0 |

TABLE 13-2

| | | | | | | | | | | | |
|---|---|---|---|---|---|---|---|---|---|---|---|
| | FF | 0 | 0 | 0 | 0 | 0 | 0 | 1 | 1 | 1 | ← 1376 |
| | FT | 0 | 0 | 0 | 1 | 1 | 1 | 0 | 0 | 0 | ← 1377 |
| | TF | 0 | 0 | 1 | 0 | 0 | 1 | 0 | 0 | 1 | ← 1378 |
| | TT | 0 | 1 | 0 | 0 | 1 | 0 | 0 | 1 | 0 | ← 1379 |
| A | B | A | A*B | A*B̄ | A+B | B | AXB | A+B̄ | ĀXB | B̄ | ← 1347 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

1380 brackets rows 1376–1379

US 10,529,387 B2

APPARATUSES AND METHODS FOR PERFORMING LOGICAL OPERATIONS USING SENSING CIRCUITRY

PRIORITY INFORMATION

This application is a Continuation of U.S. application Ser. No. 15/685,643, filed Aug. 24, 2017, which is a Continuation of U.S. application Ser. No. 14/921,509, filed Oct. 23, 2015, which issued as U.S. Pat. No. 9,779,784 on Oct. 3, 2017, which claims the benefit of U.S. Provisional Application No. 62/069,944, filed Oct. 29, 2014, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in an electronic system may be involved in providing instructions to the functional unit circuitry for execution. The instructions may be generated, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing.

BRIEF DESCRIPTION OF THE DRAWINGS

FIG. 7 is a logic table illustrating selectable logic operation results implemented by a sensing circuitry with a logic operation result in a compute component after a sense amplifier is enabled in accordance with a number of embodiments of the present disclosure.

FIG. 8 is a logic table illustrating selectable logic operation results implemented by a sensing circuitry with a logic operation result in a sense amplifier after the sense amplifier is enabled in accordance with a number of embodiments of the present disclosure.

DETAILED DESCRIPTION

Figure 1:
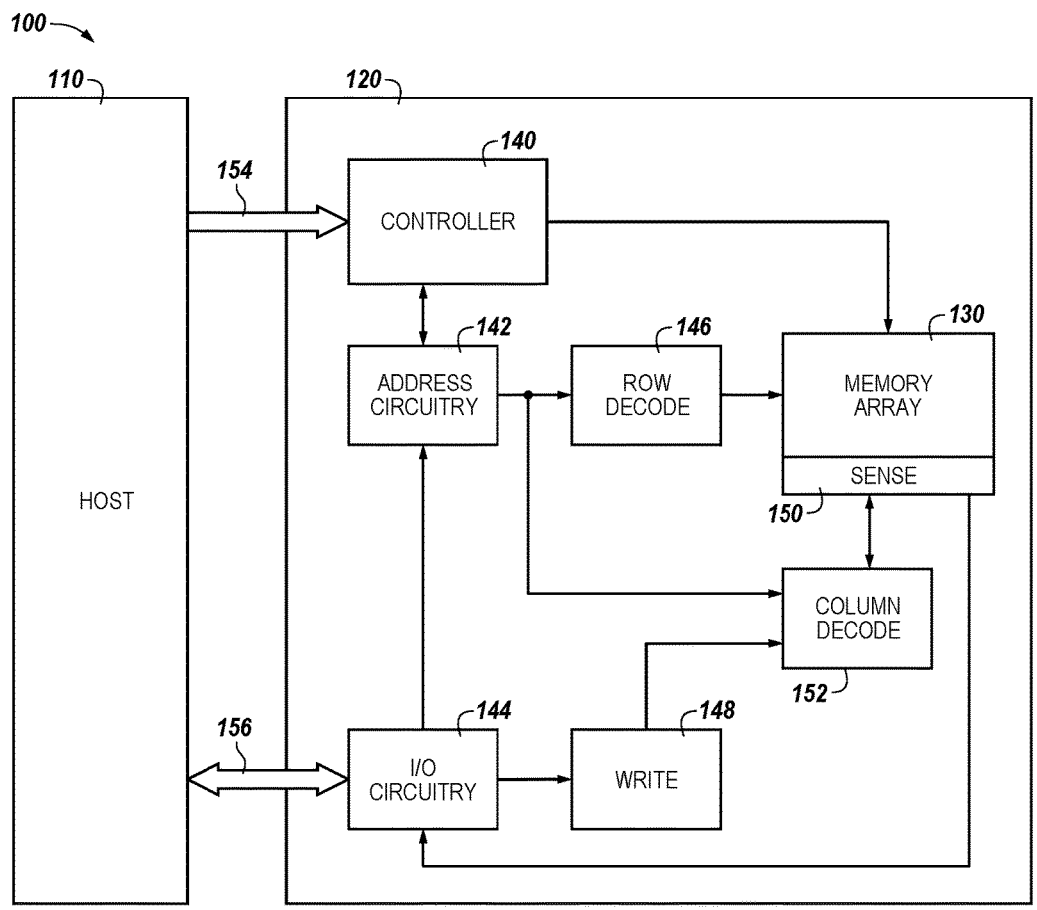
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array. The sensing circuitry can include a sense amplifier coupled to a pair of complementary sense lines and a compute component coupled to the sense amplifier via pass gates coupled to logical operation selection logic. The logical operation selection logic can be configured to control pass gates based on a selected logical operation.

According to various embodiments of the present disclosure, sensing circuitry is configured to implement one of a plurality of selectable logic operations, including XOR and XNOR logic operations. A result of the selected logic operation is based on a first data value stored in a sense amplifier and a second data value stored in a compute component (e.g., an accumulator, shift circuit). The result of the selected logic operation is initially stored in the sense amplifier for some selected logic operations, and is initially stored in the compute component for some selected logic operations. Some selected logic operations can be implemented so as to have the result stored in either the sense amplifier or the compute component. As described further herein, in a number of embodiments, whether a result of a logical operation is initially stored in the sense amplifier or the compute component can depend on when logical selection control signals corresponding to a selected logical operation to be performed are provided to logical selection logic of the sensing circuitry (e.g., whether the logic selection control signals are fired before or after the sense amplifier is fired). According to some embodiments, logical operation selection logic is configured to control pass gates (e.g., control continuity of the pass gates) based on a data value stored in the compute component and the selected logical operation. Controlling continuity of a gate (e.g., transistor) may be used herein to refer to controlling whether or not the gate is conducting (e.g., whether a channel of the transistor is in a conducting or non-conducting state).

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as sense amplifier set, sense amplifier clear, copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the circuitry to perform the compute function.

Some advantages of embodiments of the present disclosure over previous approaches can include capability for implementing a greater quantity of logical operations using a same circuit configuration, and increased flexibility in implementing a plurality of logical operations. Logical operations can be selected dynamically from among a number of possible logical operations. Capability to select a number of different logical operations to implement directly can result in faster operations with fewer manipulations and movements (e.g., storing intermediate results) of data. And direct implementation of a plurality of different logical operations can use less power to obtain a result due in part to less movement of intermediate results. Also, embodiments of the present disclosure can be used to directly implement XOR and XNOR logical operations (e.g., in a single operation), rather than by obtaining the result via one or more logical operations involving intermediate results.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, a controller 140, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals may also be received to controller 140 (e.g., via address circuitry 142 and/or via bus 154). Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of control circuitry. Controller 140 can be implemented in hardware, firmware, and/or software. Controller 140 can also control shifting circuitry, which can be implemented, for example, in the sensing circuitry 150 according to various embodiments.

Examples of the sensing circuitry 150 are described further below. For instance, in a number of embodiments, the sensing circuitry 150 can comprise a number of sense amplifiers (e.g., sense amplifier 206 shown in FIG. 2 or sense amplifier 506 shown in FIG. 5) and a number of compute components (e.g., compute component 231 shown in FIG. 2 or compute component 431 shown in FIG. 4A), which can be used to perform logical operations (e.g., on data associated with complementary data lines). The sense amplifier can comprise a static latch, for example, which can be referred to herein as the primary latch. The compute component 231 can comprise a dynamic and/or static latch, for example, which can be referred to herein as the secondary latch, and which can serve as, and be referred to as, an accumulator.

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array (e.g., 130) via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, various circuitry external to array 130 and sensing circuitry 150 (e.g., external registers associated with an ALU) is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
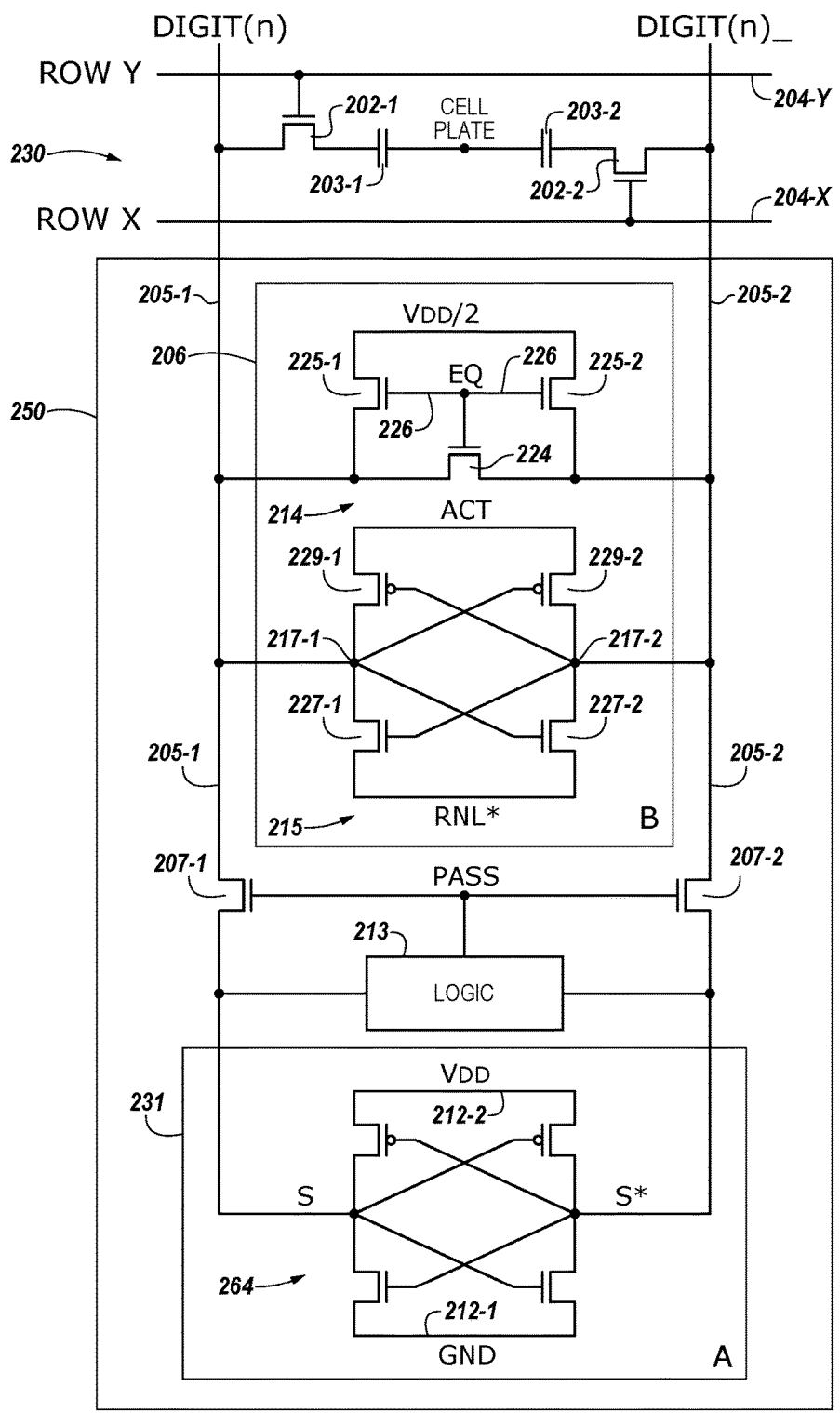
FIG. 2 is a schematic diagram illustrating sensing circuitry in accordance with a number of embodiments of the present disclosure.

FIG. 2 is a schematic diagram illustrating sensing circuitry in accordance with a number of embodiments of the present disclosure. A memory cell comprises a storage element (e.g., capacitor) and an access device (e.g., transistor). For instance, transistor 202-1 and capacitor 203-1 comprise a memory cell, and transistor 202-2 and capacitor 203-2 comprise a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (ROW X), 204-Y (ROW Y), etc., and columns coupled by pairs of complementary sense lines (e.g., data lines DIGIT(n)/DIGIT(n)_). The individual sense lines corresponding to each pair of complementary sense lines can also be referred to as data lines 205-1 (D) and 205-2 (D_) respectively. Although only one pair of complementary data lines (e.g., one column) are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sensing circuitry 250 can correspond to sensing circuitry 150 shown in FIG. 1, for example. The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines 205-1 and 205-2 un-transposed between the sense amplifier 206 and the compute component 231 (as shown in FIG. 2) and/or swap gate logic for controlling swap gates that couple the pair of complementary sense lines transposed between the sense amplifier 206 and the compute component 231 (as is discussed later with respect to FIGS. 11, 12, 14, and 15, for example). The logical operation selection logic 213 can also be coupled to the pair of complementary sense lines 205-1 and 205-2. The logical operation selection logic 213 can be configured to control pass gates 207-1 and 207-2 (e.g., to control whether the pass gates 207-1 and 207-2 are in a conducting state or a non-conducting state) based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to the pair of complementary data lines 205-1 and 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2).

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal can be driven high and the RNL* signal can be driven low to enable (e.g., fire) the sense amplifier 206. The data line 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{DD}$ (e.g., through a source transistor (not shown)), and the other data line 205-1 (D) or 205-2 (D_) is driven to the voltage of the reference voltage (e.g., to ground (GND) through a sink transistor (not shown)). Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments can eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logical functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 2, the compute component 231 can also comprise a latch 264, which can be referred to herein as a secondary latch. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

Figure 3:
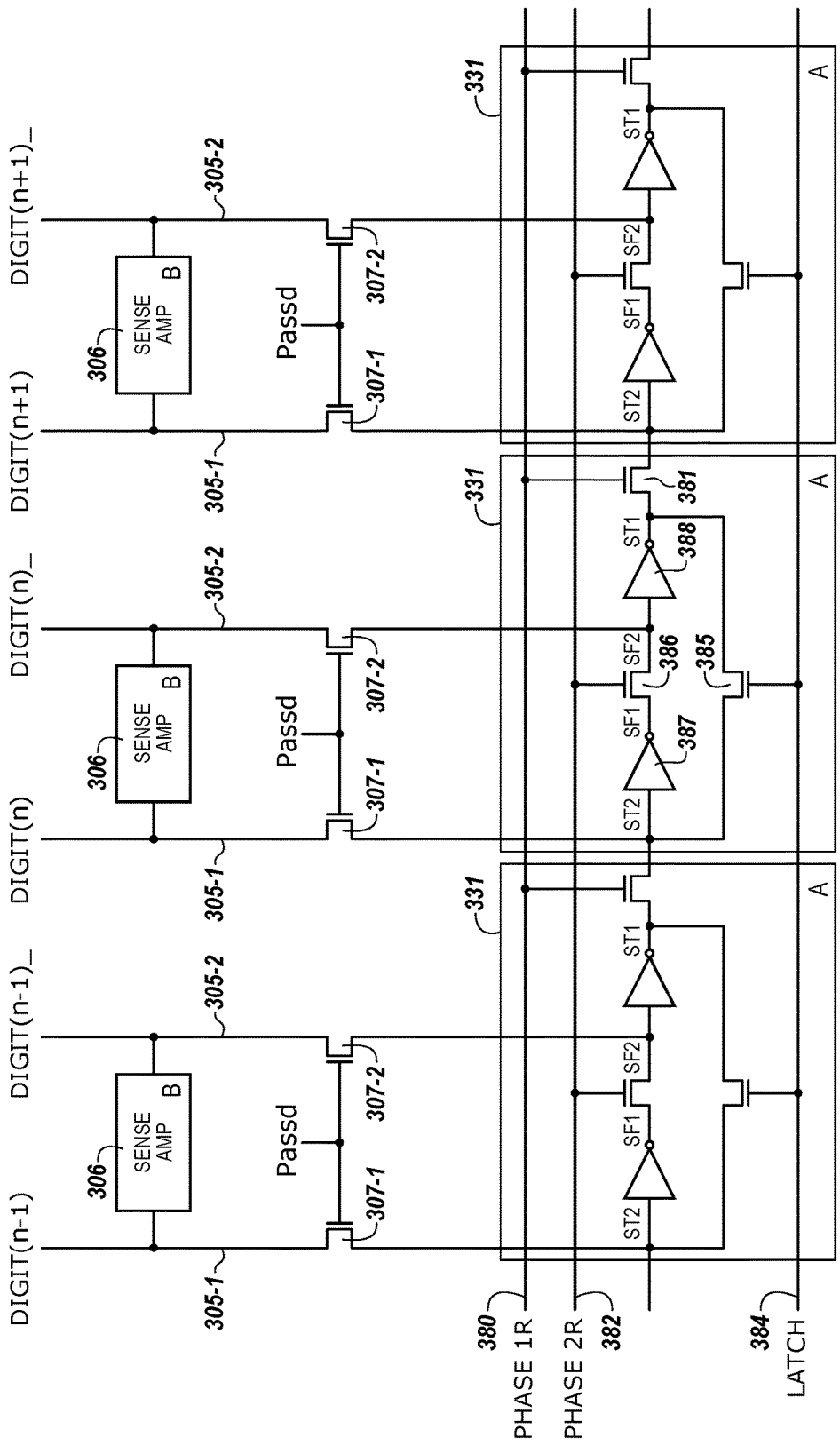
FIG. 3 is a schematic diagram illustrating sensing circuitry having a compute component with shift capabilities in accordance with a number of embodiments of the present disclosure.

FIG. 3 is a schematic diagram illustrating sensing circuitry having a compute component with shift capabilities in accordance with a number of embodiments of the present disclosure. According to some embodiments, the compute component can have unidirectional shift capabilities. FIG. 3 shows a number of sense amplifiers 306 coupled to respective pairs of complementary sense lines 305-1 and 305-2, and a number of compute components 331 coupled to the sense amplifiers 306 via respective pass gates 307-1 and 307-2. The gates of the pass gates 307-1 and 307-2 can be controlled by a logical operation selection logic signal, Passd, which can be output from logical operation selection logic (not shown in FIG. 3 for clarity).

According to various embodiments of the present disclosure, the compute components 331 can comprise respective stages (e.g., shift cells) of a loadable shift register configured to shift in one direction (e.g., right as configured in FIG. 3). The loadable shift register can be coupled to the pairs of complementary sense lines 305-1 and 305-2, with node ST2 of each stage being coupled to the sense line (e.g., DIGIT (n)) communicating a true data value and with node SF2 of each stage being coupled to the sense line (e.g., DIGIT(n)_) communicating a complementary (e.g., false) data value.

The compute components 331 (e.g., stages) of the loadable shift register can comprise a first right-shift transistor 381 having a gate coupled to a first right-shift control line 380 (e.g., "PHASE 1R"), and a second right-shift transistor 386 having a gate coupled to a second right-shift control line 382 (e.g., "PHASE 2R"). Node ST2 of each stage of the loadable shift register is coupled to an input of a first inverter 387. The output of the first inverter 387 (e.g., node SF1) is coupled to one source/drain of the second right-shift transistor 386, and another source/drain of the second right-shift transistor 386 is coupled to an input of a second inverter 388 (e.g., node SF2). The output of the second inverter 388 (e.g., node ST1) is coupled to one source/drain of the first right-shift transistor 381, and another source/drain of the first right-shift transistor 381 is coupled to an input of a second inverter (e.g., node SF2) for an adjacent compute component 331. Latch transistor 385 has a gate coupled to a LATCH control signal 384. One source/drain of the latch transistor 385 is coupled to node ST2, and another source/drain of the latch transistor 385 is coupled to node ST1.

Data values on the respective pairs of complementary sense lines 305-1 and 305-2 can be loaded into the corresponding compute components 331 (e.g., loadable shift register) by causing the pass gates 307-1 and 307-2 to conduct, such as by causing the Passd control signal to go high. Gates that are controlled to have continuity (e.g., electrical continuity through a channel) are conducting, and can be referred to herein as being OPEN. Gates that are controlled to not have continuity (e.g., electrical continuity through a channel) are said to be non-conducting, and can be referred to herein as being CLOSED. For instance, continuity refers to a low resistance condition in which a gate is conducting. The data values can be loaded into the respective compute components 331 by either the sense amplifier 306 overpowering the corresponding compute component 331 (e.g., to overwrite an existing data value in the compute component 331) and/or by turning off the PHASE 1R and PHASE 2R control signals 380 and 382 and the LATCH control signal 384. A first latch (e.g., sense amplifier) can be configured to overpower a second latch (e.g., compute component) when the current provided by the first latch and presented to the second latch is sufficient to flip the second latch.

The sense amplifier 306 can be configured to overpower the compute component 331 by driving the voltage on the pair of complementary sense lines 305-1 and 305-2 to the maximum power supply voltage corresponding to a data value (e.g., driving the pair of complementary sense lines 305-1 and 305-2 to the rails), which can change the data value stored in the compute component 331. According to a number of embodiments, the compute component 331 can be configured to communicate a data value to the pair of complementary sense lines 305-1 and 305-2 without driving the voltages of the pair of complementary sense lines 305-1 and 305-2 to the rails (e.g., to $V_{DD}$ or GND). As such, the compute component 331 can be configured to not overpower the sense amplifier 306 (e.g., the data values on the pair of complementary sense lines 305-1 and 305-2 from the compute component 331 will not change the data values stored in the sense amplifier 306 until the sense amplifier is enabled.

Once a data value is loaded into a compute component 331 of the loadable shift register, the true data value is separated from the complement data value by the first inverter 387. The data value can be shifted to the right (e.g., to an adjacent compute component 331) by alternate operation of first right-shift transistor 381 and second right-shift transistor 386, which can be accomplished when the first right-shift control line 380 and the second right-shift control line 382 have periodic signals that go high out-of-phase from one another (e.g., non-overlapping alternating square waves 180 degrees out of phase with one another). LATCH control signal 384 can be activated to cause latch transistor 385 to conduct, thereby latching the data value into a corresponding compute component 331 of the loadable shift register (e.g., while signal PHASE 1R remains low and PHASE 2R remains high to maintain the data value latched in the compute component 331).

Figure 4A:
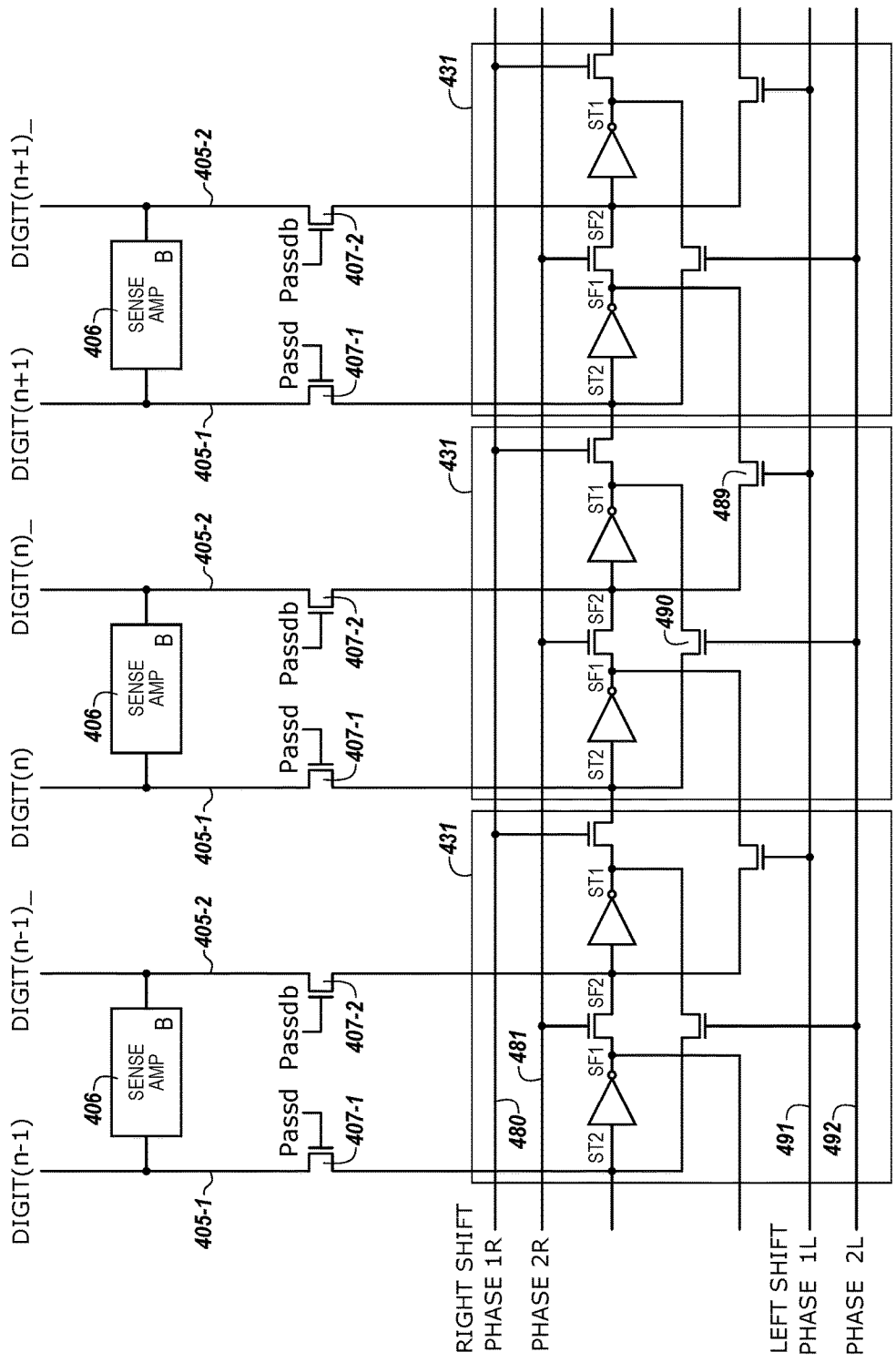
FIG. 4A is a schematic diagram illustrating sensing circuitry having a compute component with shift capabilities in accordance with a number of embodiments of the present disclosure.

FIG. 4A is a schematic diagram illustrating sensing circuitry having a compute component with shift capabilities in accordance with a number of embodiments of the present disclosure. According to some embodiments, the compute component can have bidirectional shift capabilities. According to various embodiments of the present disclosure, the compute components 431 can comprise a loadable shift register (e.g., with each compute component 431 serving as a respective shift stage) configured to shift in multiple directions (e.g., right and left as configured in FIG. 4A). FIG. 4A shows a number of sense amplifiers 406 coupled to respective pairs of complementary sense lines 405-1 and 405-2, and corresponding compute components 431 coupled to the sense amplifiers 406 via respective pass gates 407-1 and 407-2. The gates of the pass gates 407-1 and 407-2 can be controlled by respective logical operation selection logic signals, "Passd" and "Passdb," which can be output from logical operation selection logic (not shown in FIG. 4A for clarity).

The loadable shift register shown in FIG. 4A is configured similar to the loadable shift register shown in FIG. 3. A first left-shift transistor 489 is coupled between node SF2 of one loadable shift register to node SF1 of a loadable shift register corresponding to an adjacent compute component 431. Latch transistor 385 shown in FIG. 3 has been replaced by the second left-shift transistor 490. The channel of second left-shift transistor 490 is coupled from node ST2 to node ST1. The gate of the first left-shift transistor 489 is coupled to a first left-shift control line 491 (e.g., "PHASE 1L"), and the gate of the second left-shift transistor 490 is coupled to a second left-shift control line 492 (e.g., "PHASE 2L").

Figure 4B:
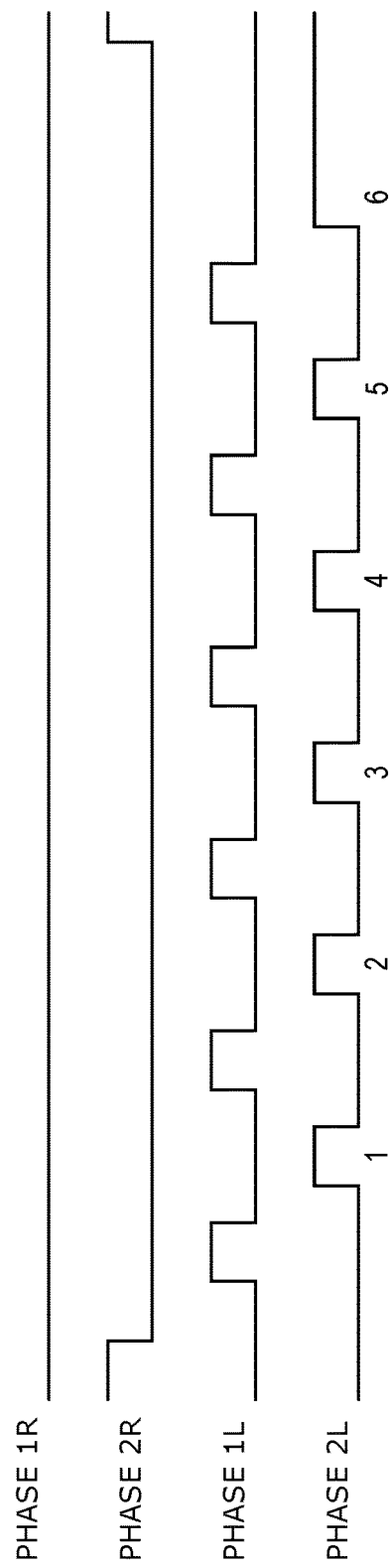
FIG. 4B is a timing diagram illustrating operation of the sensing circuitry shown in FIG. 4A in accordance with a number of embodiments of the present disclosure.

FIG. 4B is a timing diagram illustrating operation of the sensing circuitry shown in FIG. 4A in accordance with a number of embodiments of the present disclosure. FIG. 4B shows waveforms for signals PHASE 1R (e.g., on first right-shift control line 480 shown in FIG. 4A), PHASE 2R (e.g., on second right-shift control line 481 shown in FIG. 4A), PHASE 1L (e.g., on first left-shift control line 491 shown in FIG. 4A), and PHASE 2L (e.g., on second left-shift control line 492 shown in FIG. 4A) to accomplish shifting data left by 6 sensing circuitries (e.g., by 6 compute components 431). The first 491 and second 492 left-shift control lines can communicate control signals similar to those described with respect to FIG. 3 for the first and second right-shift control lines above.

Whereas data is moved right through transistors 381 and 386 shown in FIG. 3, since signals PHASE 1R and PHASE 2R are low during the left-shifting process, transistors 381 and 386 shown in FIG. 3 are off (e.g., no continuity) and data moves left by a different path. The control signals on the first 491 and second 492 left-shift control lines operate the loadable shift register to move data values to the left through transistors 489 and 490, as shown in FIG. 4A. Data from node ST2 is inverted through inverter 387 shown in FIG. 3 to node SF1, as previously described. Activation of PHASE 1L signal causes the data from node SF1 to move left through transistor 489 to node SF2 of a left-adjacent compute component 431. Data from node SF2 is inverted through inverter 388 shown in FIG. 3 to node ST1, as previously described. Then, activation of PHASE 2L signal causes the data from node ST1 to move through transistor 490 left to node ST2 completing a left shift. Data can be "bubbled" to the left by repeating the sequence multiple times (e.g., for each of the six iterations) as shown in FIG. 4B. Latching of the data value (e.g., into a latch of a particular compute component 431 so that the data value is not shifted further) can be accomplished by maintaining the PHASE 2L signal 492 in an activated (e.g., high) state such that second left-shift transistor 490 is conducting, by maintaining the PHASE 1L signal 491 in a deactivated (e.g., low) state such that first left-shift transistor 489 is not conducting, by maintaining the PHASE 1R signal 480 in a deactivated state, and by maintaining the PHASE 2R signal 481 in an activated state, which provides feedback associated with latching the data value while electrically isolating the compute components 431 from each other.

Figure 5:
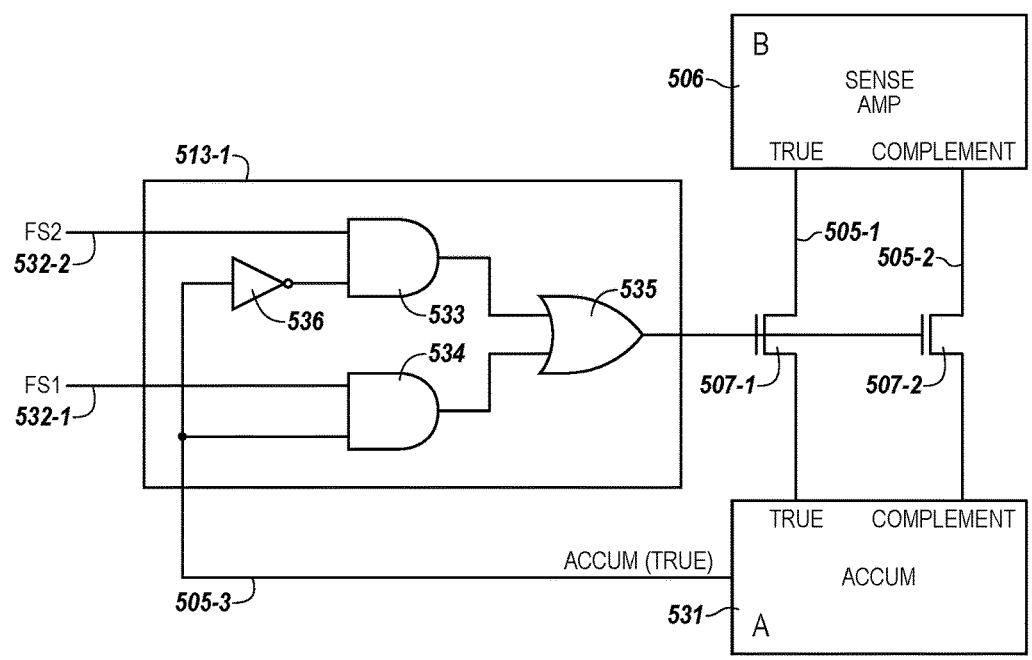
FIG. 5 is a schematic diagram illustrating sensing circuitry having selectable logical operation selection logic in accordance with a number of embodiments of the present disclosure.

FIG. 5 is a schematic diagram illustrating sensing circuitry having selectable logical operation selection logic in accordance with a number of embodiments of the present disclosure. FIG. 5 shows a sense amplifier 506 coupled to a pair of complementary sense lines 505-1 and 505-2, and a compute component 531 coupled to the sense amplifier 506 via pass gates 507-1 and 507-2. The gates of the pass gates 507-1 and 507-2 can be controlled by a logical operation selection logic signal (e.g., Passd), which can be output from logical operation selection logic 513-1. FIG. 5 shows the compute component 531 labeled "A" and the sense amplifier 506 labeled "B" to indicate that the data value stored in the compute component 531 represents the "A" data value and the data value stored in the sense amplifier 506 represents the "B" data value shown in logic tables described below.

According to some embodiments, logical operation selection logic 513-1 can comprise a number of logic gates configured to control pass gates 507-1 and 507-2 based on logic selection signal(s) applied to a first logic select control line 532-1 (e.g., FS1) and applied to a second logic select control line 532-2 (e.g., F S2). As shown in FIG. 5, the first logic select control line 532-1 is one input to AND gate 534, and the second logic select control line 532-2 is one input to AND gate 533. A true data value from the compute component 531 is a second input 505-3 to AND gate 534, and the true data value is inverted via inverter 536 such that an inverted true data value (e.g., complement data value) from the compute component 531 is a second input to AND gate 533. Outputs of AND gates 533 and 534 are inputs to OR gate 535, and the output of OR gate 535, which can correspond to the Passd signal shown in FIG. 3, is coupled to the gates of pass transistors 507-1 and 507-2.

Figure 6:
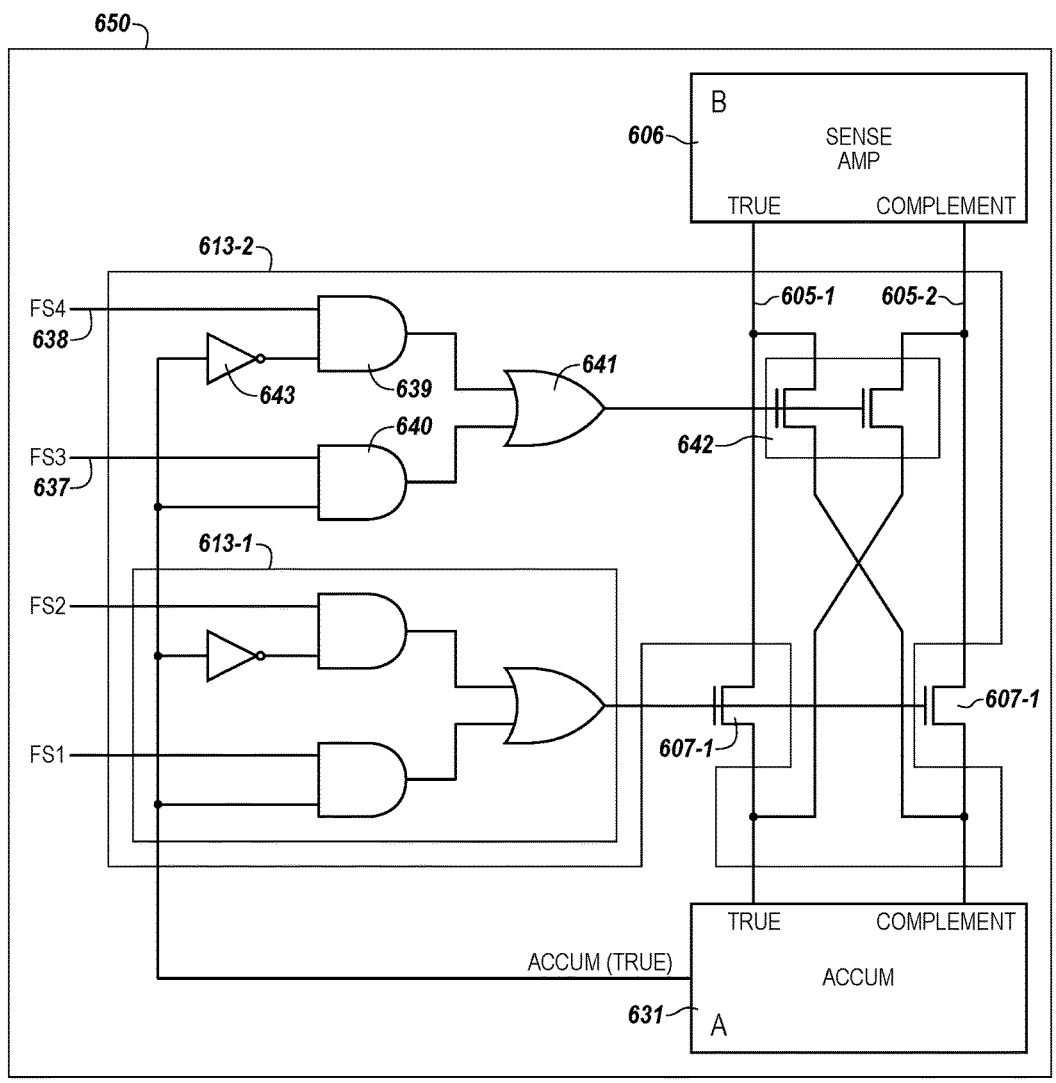
FIG. 6 is a schematic diagram illustrating sensing circuitry having selectable logical operation selection logic in accordance with a number of embodiments of the present disclosure.

FIG. 6 is a schematic diagram illustrating sensing circuitry having selectable logical operation selection logic in accordance with a number of embodiments of the present disclosure. FIG. 6 shows a sense amplifier 606 coupled to a pair of complementary sense lines 605-1 and 605-2, and a compute component 631 coupled to the sense amplifier 606 via pass gates 607-1 and 607-2. The gates of the pass gates 607-1 and 607-2 can be controlled by a logical operation selection logic signal (e.g., Passd), which can be output from logical operation selection logic 613-2. FIG. 6 shows the compute component 631 labeled "A" and the sense amplifier 606 labeled "B" to correspond to the data value stored therein with respect to the logic tables shown in FIGS. 7 and 8.

Logical operation selection logic 613-2 comprises one portion 613-1 configured the same as described with respect to logical operation selection logic 513-1 shown in FIG. 5. In addition, logical operation selection logic 613-2 comprises logic gates that drive swap gates 642. Swap gates 642 comprise a pair of transistors that couple the true sense line on one side of the pass gates 607-1 and 607-2 to the complement sense line on the other side of the pass gates 607-1 and 607-2. When pass gates 607-1 and 607-2 are CLOSED (e.g., not conducting) and swap gates 642 are OPEN (e.g., conducting), the true and complement data values are swapped in communication to the compute component 631, such that the true data value from the sense amplifier 606 is loaded into the compute component 631 as the complement data value, and the complement data value from the sense amplifier 606 is loaded into the compute component 631 as the true data value.

As shown in FIG. 6, logical operation selection logic 613-2 can comprise a number of logic gates configured to control the swap gates 642 based on additional logic selection signal(s) applied to a third logic select control line 637 (e.g., FS3) and applied to a fourth logic select control line 638 (e.g., FS4). As shown in FIG. 6, the third logic select control line 637 is one input to AND gate 640, and the fourth logic select control line 638 is one input to AND gate 639. A true data value from the compute component 631 is a second input to AND gate 640, and the true data value is inverted via inverter 643 such that an inverted true data value (e.g., complement data value) from the compute component 631 is a second input to AND gate 639. Outputs of AND gates 639 and 640 are inputs to OR gate 641, and the output of OR gate 641 is coupled to the gates of the swap transistors 642.

Logic selection signals FS1, FS2, FS3, and FS4 can be used to select a logical operation to be implemented by the sensing circuitry 650 based on the data value stored in the compute component (e.g., the "A" data value) and the data value stored in the sense amplifier (e.g., the "B" data value). The results of logical operations for various combinations of the data value stored in the compute component (e.g., "A"), the data value stored in the sense amplifier (e.g., "B"), and the states of the logic selection signals FS1, FS2, FS3, and FS4 is shown in FIGS. 7 and 8 below.

FIG. 7 is a logic table illustrating selectable logic operation results implemented by a sensing circuitry with a logic operation result in a compute component (e.g., an accumulator) after a sense amplifier is enabled in accordance with a number of embodiments of the present disclosure. FIG. 7 shows a resultant data value that is initially stored in the compute component (e.g., 631 shown in FIG. 6) after the sense amplifier 606 is enabled (e.g., fired). Starting data values (e.g., operands) for a particular logical operation can be loaded into the sense amplifier 606 and/or compute component 631 from the memory array (e.g., as described in FIGS. 16-18). For instance, as described in FIGS. 16-18, a first operand (e.g., "A") can be read from a memory array and stored in a latch of compute component 631, and a selected logical operation between the first operand and a second operand (e.g., "B"), which can also be read from the memory array, can be performed based on the appropriate control signals corresponding to the selected operation being provided to the operation selection control logic (e.g., 613-2). As described further herein, whether the result of a selected logical operation is initially stored in the compute component or the sense amplifier can depend on when the operation selection logic is enabled (e.g., whether the control signals FS1, FS2, FS3, and FS4 are enabled before or after the sense amplifier being enabled in association with sensing the second operand). For instance, in FIG. 7, "RESULT IN ACCUM—(AFTER SENSE AMP FIRE)" indicates that the control signals corresponding to the selected logic operation are enabled after the sense amplifier is enabled, such that the result of the selected logic operation is initially stored in the compute component (e.g., accumulator latch). Similarly, in FIG. 8, "RESULT IN SENSE AMP—(BEFORE SENSE AMP FIRE)" indicates that the control signals corresponding to the selected logic operation are enabled before the sense amplifier is enabled, such that the result of the selected logic operation is initially stored in the sense amplifier, as described further below.

The logic table illustrated in FIG. 7 shows the starting data value stored in the compute component 631 in column A at 744, and shows the starting data value stored in the sense amplifier 606 in column B at 745. The various combination of logic selection signals FS1, FS2, FS3, and FS4 is shown in FIG. 7 in the column headings in row 746. For example, the column heading of "0110" indicates that the results in that column correspond to logic selection signal FS4 being a "0," logic selection signal FS3 being a "1," logic selection signal FS2 being a "1," and logic selection signal FS1 being a "0."

The results for each combination of starting data values in the compute component 631 ("A") and in the sense amplifier 606 ("B") can be summarized by the logical operation shown for each column in row 747. For example, the results for the values of FS4, F3, FS2, and FS1 of "0000" are summarized as "A" since the result (initially stored in the compute component after the sense amplifier fires) is the same as the starting value in the compute component. Other columns of results are similarly annotated in row 747, where "A*B" intends A AND B, "A+B" intends A OR B, and "AXB" intends A XOR B. By convention, a bar over a data value or a logical operation indicates an inverted value of the quantity shown under the bar. For example, AXB bar intends not A XOR B, which is also A XNOR B. Some combination of the values of FS4, F3, FS2, and FS1 may not be implementable with the circuit shown in FIG. 6 (e.g., since such combinations can result in the sense lines 605-1 and 605-2 being shorted together), and these are indicated at columns 748 by "X"s in place of binary data value results for a particular combination.

FIG. 8 is a logic table illustrating selectable logic operation results implemented by a sensing circuitry with a logic operation result in a sense amplifier after the sense amplifier is enabled in accordance with a number of embodiments of the present disclosure. FIG. 8 shows a resultant data value that is initially stored in the sense amplifier (e.g., 606 shown in FIG. 6) after the sense amplifier 606 is enabled corresponding to the various combination of logic selection signals FS4, FS3, FS2, and FS1. The logic table illustrated is arranged similar to that described with respect to FIG. 7, with the starting data value stored in the compute component 631 shown in column A at 844, and the starting data value stored in the sense amplifier 606 shown in column B at 845. The various combination of logic selection signals FS1, FS2, FS3, and FS4 is shown in FIG. 8 in the column headings shown in row 846, and the logical operation represented by each respective column of results shown in the column subheading at row 847.

In contrast with the logical operations summarized in the logic table illustrated in FIG. 7, which reflects a logical operation result initially stored in the compute component 631 after the sense amplifier 606 is enabled, the logical operations summarized in the logic table illustrated in FIG. 8 reflects a logical operation result initially stored in the sense amplifier 606 after the sense amplifier is enabled (e.g., with the logic selection signals corresponding to the selected logic operation being provided to the selection logic before the sense amplifier is enabled). The logical operations summarized in the logic table illustrated in FIG. 8 include several different logical operations from those shown in the logic table illustrated in FIG. 7 including "B" (the logical operation result initially stored in the sense amplifier 606 after the sense amplifier is enabled is the same as the starting data value in the sense amplifier), "RESET" (the logical operation result initially stored in the sense amplifier 606 after the sense amplifier is enabled is always set to "0"), and "SET" (the logical operation result initially stored in the sense amplifier 606 after the sense amplifier is enabled is always set to "1"). As was similarly shown in the logic table illustrated in FIG. 7, some combination of the values of FS4, F3, FS2, and FS1 may not be implementable with the circuit described in FIG. 6, and these are indicated at columns 848 in the logic table illustrated in FIG. 8 by "X"s in place of binary data value results for a particular combination of starting data values.

Figure 9:
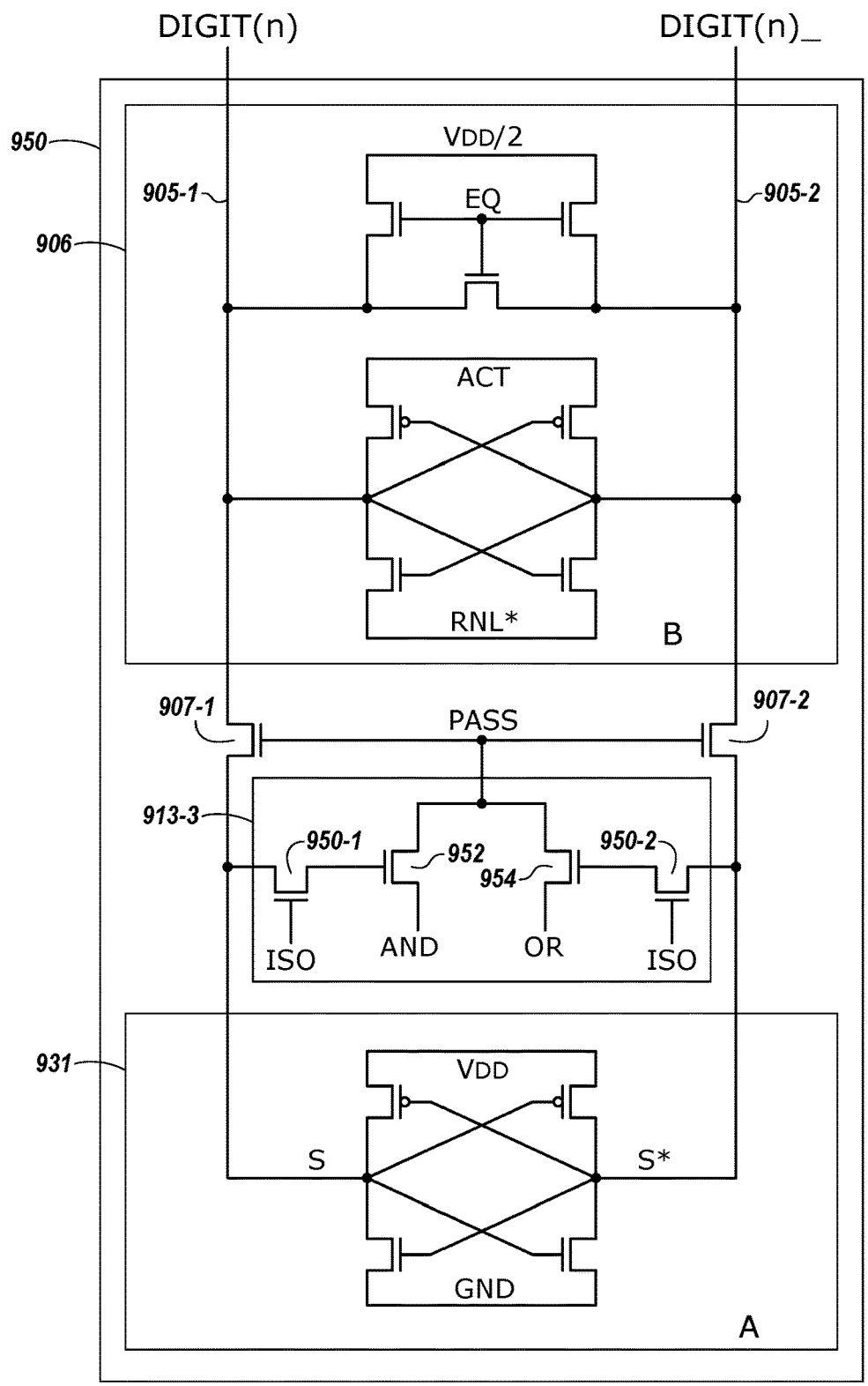
FIG. 9 is a schematic diagram illustrating sensing circuitry having selectable logical operation selection logic in accordance with a number of embodiments of the present disclosure.

FIG. 9 is a schematic diagram illustrating sensing circuitry having selectable logical operation selection logic in accordance with a number of embodiments of the present disclosure. FIG. 9 shows a sense amplifier 906 coupled to a pair of complementary sense lines 905-1 and 905-2, and a compute component 931 coupled to the sense amplifier 906 via pass gates 907-1 and 907-2. The gates of the pass gates 907-1 and 907-2 can be controlled by a logical operation selection logic signal, PASS, which can be output from logical operation selection logic 913-3. FIG. 9 shows the compute component 931 labeled "A" and the sense amplifier 906 labeled "B" to indicate that the data value stored in the compute component 931 is the "A" data value and the data value stored in the sense amplifier 906 is the "B" data value shown in the logic tables illustrated with respect to FIG. 10.

The sensing circuitry 950 shown in FIG. 9 is similar to that shown for the sensing circuitry 250 shown in FIG. 2 with detail added with respect to the logical operation selection logic 913-3. Logical operation selection logic 913-3 provides another logic configuration for selecting a particular logical operation to implement. Logical operation selection logic 913-3 comprises a first enable transistor 952 coupled between an AND logic signal control line and the gates of the pass transistors 907-1 and 907-2 (e.g., a first source/drain of transistor 952 is coupled to the AND signal, and a second source/drain of the transistor 952 is coupled to the gates of transistors 907-1 and 907-2). The gate of the first enable transistor 952 is coupled through a first isolation transistor 950-1 to node "S" of the latch of compute component 931. The gate of the first isolation transistor 950-1 is coupled to an ISO control signal (e.g., to a control line to which the ISO signal is applied). As used herein, the name of a particular signal (e.g., "ISO") may refer to the particular signal and/or to the signal line to which the particular signal is applied. Logical operation selection logic 913-3 also comprises a second enable transistor 954 coupled between an OR logic signal control line and the gates of the pass transistors 907-1 and 907-1. The gate of the second enable transistor 954 is coupled through a second isolation transistor 950-2 to node "S*" of the latch of compute component 931. The gate of the second isolation transistor 950-2 is also coupled to the ISO control signal.

A particular logical operation to be performed (e.g., between an "A" data value in the compute component and a "B" data value in the sense amp 906) can be selected based on the state of the AND logic signal and the state of the OR logic signal when the ISO control signal is deactivated (e.g., brought low to isolate the gates of the enable transistors 952 and 954 from S and S*, respectively). Isolating the gates of the first enable transistor 952 and the second enable transistor 954 from the respective nodes S and S* of the compute component 931 leaves the corresponding voltages dynamically on the gates of respective transistors 952 and 954. As such, as described further below, the state of the PASS signal depends on the selected states of the AND and OR signals as well as on the value stored in compute component 931 (e.g., the voltages corresponding to S and S*) when ISO is deactivated. The selection of a particular logical operation to be implemented is discussed further with respect to FIG. 10.

Figure 10:
FIG. 10 is a logic table illustrating selectable logic operation results implemented by a sensing circuitry in accordance with a number of embodiments of the present disclosure.

FIG. 10 is a logic table illustrating selectable logic operation results implemented by a sensing circuitry in accordance with a number of embodiments of the present disclosure. The logic table illustrated in FIG. 10 shows the starting data value stored in the compute component 931 shown in column A at 1044, and the starting data value stored in the sense amplifier 906 shown in column B at 1045. The column headings for the Logic Table 10-1 refer to the state of the pass gates 907-1 and 907-2, which can be controlled to be OPEN (e.g., conducting) or CLOSED (e.g., not conducting) depending on the state of the AND logic signal, the state of the OR logic signal, and the data values on the pair of complementary sense lines 905-1 and 905-2 when the ISO control signal is activated/deactivated. In order to control the pass gates to be OPEN (e.g., conducting), the AND logic signal has to be activated and the data value on the true sense line has to be high, or the OR logic signal has to be activated and the data value on the complement sense line has to be high, otherwise the pass gates 907-1 and 907-2 will be CLOSED (e.g., not conducting).

The logic tables illustrated in FIG. 10 reflect a result (e.g., of a logical operation performed between a data value A and a data value B) that is initially stored in the compute component 931. Therefore, when the pass gates 907-1 and 907-2 are controlled to be CLOSED (e.g., not conducting), the result initially stored in the compute component 931 is the same as the starting data value in the compute component 931. However, since the sense sensing circuitry 950 is configured such that the sense amplifier 906 can overpower the compute component 931 as shown in the "NOT OPEN" column 1056 of the Logic Table 10-1, the result initially stored in the compute component 931 is the same as the starting data value in the sense amplifier 906 when the pass gates 907-1 and 907-2 are controlled to be OPEN (e.g., conducting) as shown in the "OPEN PASS" column 1057 of the Logic Table 10-1. Via selective control of the pass gates 907-1 and 907-2, each of the two columns (e.g., "NOT OPEN" and "OPEN PASS") of the upper portion 1049 of Logic Table 10-1 can be combined with each of the two columns of the lower portion 1050 of Logic Table 10-1 to provide four different result combinations, corresponding to four different logical operations, as indicated by the various connecting paths shown at 1058, and as summarized in Logic Table 10-2 illustrated in FIG. 10.

Logic Table 10-2 illustrated in FIG. 10 shows the various settings for the OR logic signal in row 1046-1 and the AND logic signal in row 1046-2 for the various combinations of the starting data value stored in the compute component 931 ("A") and the starting data value stored in the sense amplifier 906 ("B"). When both the OR logic signal and the AND logic signal are "0," the pass gates 907-1 and 907-2 are controlled to be CLOSED (e.g., not conducting) and the result in the compute component 931 is the same as the starting data value in the compute component 931. When both the OR logic signal and the AND logic signal are "1," one of the pair of complementary sense lines 905-1 and 905-2 will be "1" and the pass gates 907-1 and 907-2 are controlled to be OPEN (e.g., conducting) so that the starting data value in the sense amplifier 906 ("B") overwrites the starting data value in the compute component 931. Logic Table 10-2 shown in FIG. 10 provides the results for other combinations of the OR logic signal, the AND logic signal, and the starting data values on the pair of complementary sense lines 905-1 and 905-2, as well as the corresponding logical function implemented.

Figure 11:
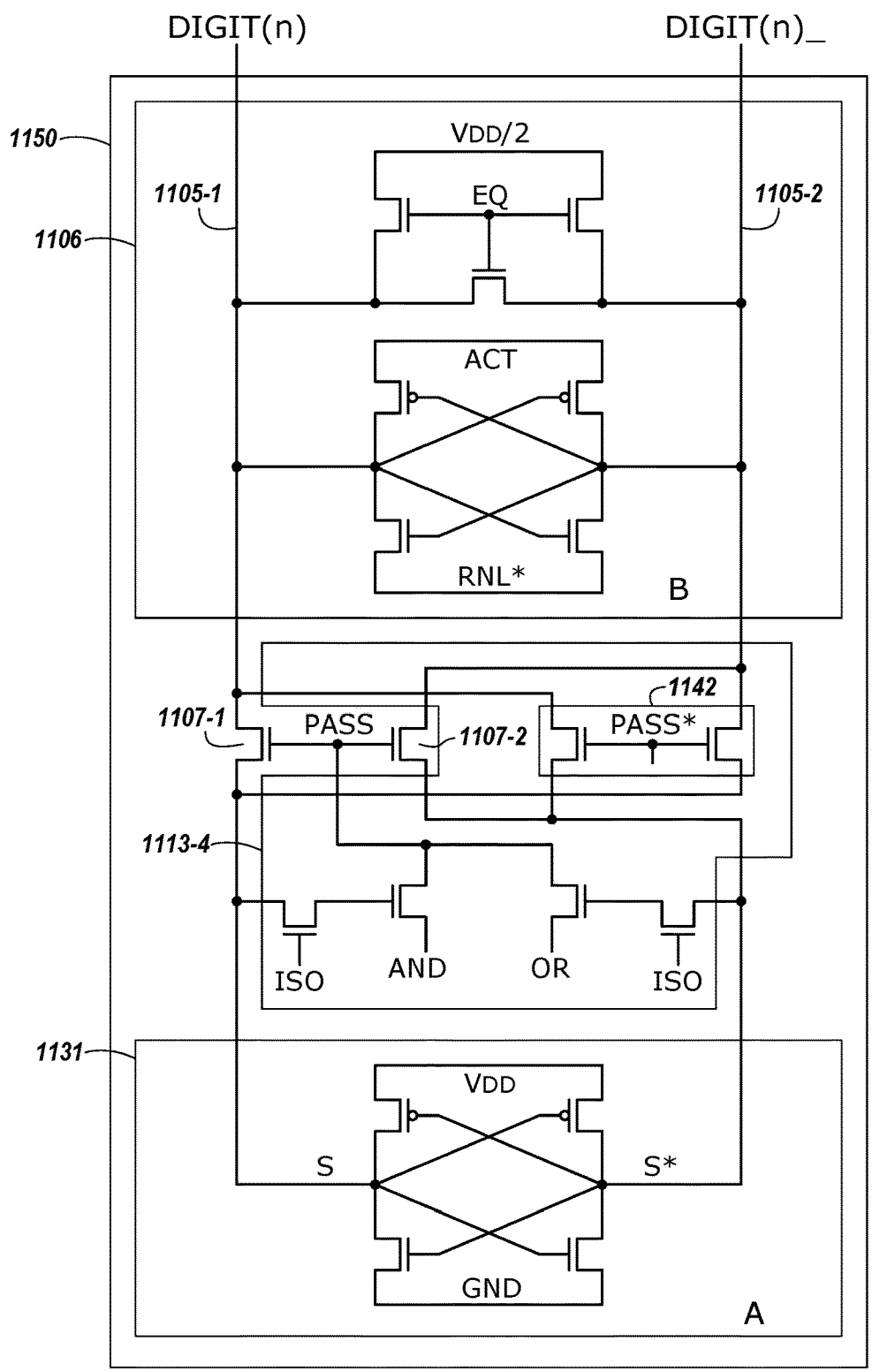
FIG. 11 is a schematic diagram illustrating sensing circuitry having selectable logical operation selection logic in accordance with a number of embodiments of the present disclosure.

FIG. 11 is a schematic diagram illustrating sensing circuitry having selectable logical operation selection logic in accordance with a number of embodiments of the present disclosure. FIG. 11 shows a sense amplifier 1106 coupled to a pair of complementary sense lines 1105-1 and 1105-2, and a compute component 1131 coupled to the sense amplifier 1106 via pass gates 1107-1 and 1107-2. The gates of the pass gates 1107-1 and 1107-2 can be controlled by a logical operation selection logic signal, PASS, which can be output from logical operation selection logic 1113-4. FIG. 11 shows the compute component 1131 labeled "A" and the sense amplifier 1106 labeled "B" to indicate that the data value stored in the compute component 1131 is the "A" data value and the data value stored in the sense amplifier 1106 is the "B" data value shown in the logic tables illustrated with respect to FIG. 13.

Similar to that illustrated for FIG. 6, logical operation selection logic 1113-4 comprises a portion configured the same as described with respect to logical operation selection logic 913-3 shown in FIG. 9. In addition, logical operation selection logic 1113-4 comprises swap gates 1142. Swap gates 1142 comprise a pair of transistors that couple the true sense line on one side of the pass gates 1107-1 and 1107-2 to the complement sense line on the other side of the pass gates 1107-1 and 1107-2. When pass gates 1107-1 and 1107-2 are OPEN (e.g., conducting) and swap gates 1142 are CLOSED (not conducting), the true and complement data values are swapped in communication to the compute component 1131, such that the true data value from the sense amplifier 1106 is loaded into the compute component 1131 as the complement data value, and the complement data value from the sense amplifier 1106 is loaded into the compute component 1131 as the true data value. The gates of swap gates 1142 are coupled to an inverted PASS (e.g., "PASS*") signal control line. The capability to swap the pair of complementary sense lines provides an ability for the sensing circuitry 1150 to implement more logical operations than can be implemented by the sensing circuitry 950, for example. Logic to control the swap gates 1142 is discussed below with respect to FIG. 12.

Figure 12:
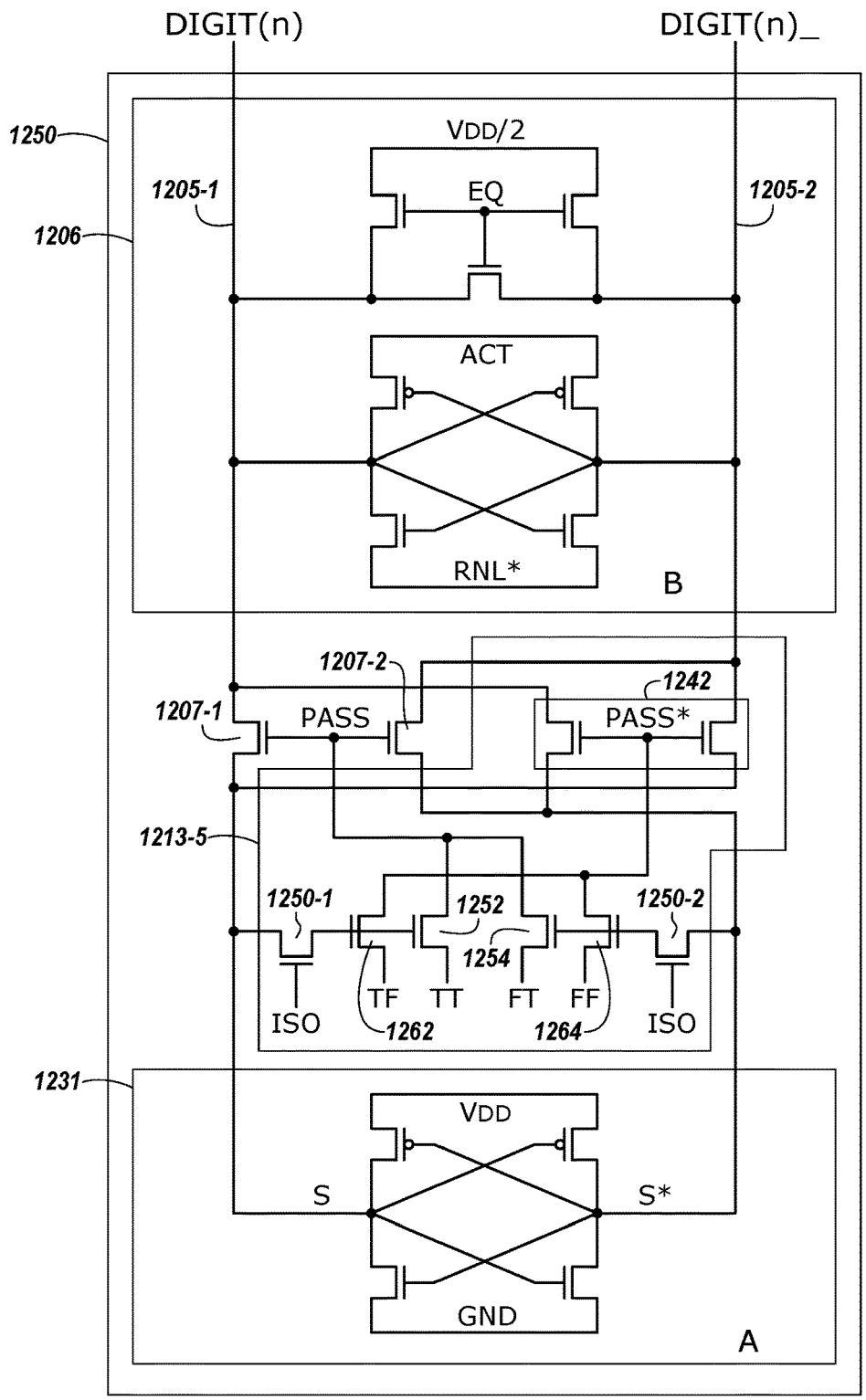
FIG. 12 is a schematic diagram illustrating sensing circuitry having selectable logical operation selection logic in accordance with a number of embodiments of the present disclosure.

FIG. 12 is a schematic diagram illustrating sensing circuitry having selectable logical operation selection logic in accordance with a number of embodiments of the present disclosure. FIG. 12 shows a sense amplifier 1206 coupled to a pair of complementary sense lines 1205-1 and 1205-2, and a compute component 1231 coupled to the sense amplifier 1206 via pass gates 1207-1 and 1207-2. The gates of the pass gates 1207-1 and 1207-2 can be controlled by a logical operation selection logic signal, PASS, which can be output from logical operation selection logic 1213-5. FIG. 12 shows the compute component 1231 labeled "A" and the sense amplifier 1206 labeled "B" to indicate that the data value stored in the compute component 1231 is the "A" data value and the data value stored in the sense amplifier 1206 is the "B" data value shown in the logic tables illustrated with respect to FIG. 13.

The sensing circuitry illustrated in FIG. 12 is similar to the sensing circuitry 1150 illustrated in FIG. 11 with the addition of logic to drive the swap transistors (and some relabeling of components for additional clarity). The logical operation selection logic 1213-5 includes the swap gates 1242, as well as logic to drive the swap gates 1242. The logical operation selection logic 1213-5 includes four logic selection transistors: logic selection transistor 1262 coupled between the gates of the swap transistors 1242 and a TF signal control line, logic selection transistor 1252 coupled between the gates of the pass gates 1207-1 and 1207-2 and a TT signal control line, logic selection transistor 1254 coupled between the gates of the pass gates 1207-1 and 1207-2 and a FT signal control line, and logic selection transistor 1264 coupled between the gates of the swap transistors 1242 and a FF signal control line. Gates of logic selection transistors 1262 and 1252 are coupled to the true sense line through isolation transistor 1250-1 (having a gate coupled to an ISO signal control line). Gates of logic selection transistors 1264 and 1254 are coupled to the complementary sense line through isolation transistor 1250-2 (also having a gate coupled to an ISO signal control line).

Logic selection transistors 1252 and 1254 are arranged similarly to transistor 952 (coupled to an AND signal control line) and transistor 954 (coupled to an OR signal control line) respectively, as shown in FIGS. 9 and 10. Operation of logic selection transistors 1262 and 1264 are similar based on the state of the TF and FF selection signals and the data values on the respective complementary sense lines at the time the ISO signal is activated/deactivated. Logic selection transistors 1262 and 1264 also operate in a similar manner to control the swap transistors 1242. For instance, to OPEN (e.g., turn on) the swap transistors 1242, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 1242 will not be OPENed despite conduction of a particular logic selection transistor 1262 and 1264.

The PASS* control signal is not necessarily complementary to the PASS control signal. It is possible for the PASS and PASS* control signals to both be activated or both be deactivated at the same time. However, activation of both the PASS and PASS* control signals at the same time shorts the pair of complementary sense lines together. Logical operations results for the sensing circuitry illustrated in FIG. 12 are summarized in the logic table illustrated in FIG. 13.

Figure 13:
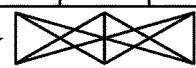
FIG. 13 is a logic table illustrating selectable logic operation results implemented by a sensing circuitry in accordance with a number of embodiments of the present disclosure.

FIG. 13 is a logic table illustrating selectable logic operation results implemented by a sensing circuitry (e.g., sensing circuitry 1250 shown in FIG. 12) in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 1206 and compute component 1231. The four control signals (e.g., TF, TT, FT, and FF), in conjunction with a particular data value present on the complementary sense lines (e.g., on nodes S and S*), controls the pass gates 1207-1 and 1207-2 and swap transistors 1242, which in turn affects the data value in the compute component 1231 and/or sense amplifier 1206 before/after firing. The capability to selectably control the swap transistors 1242 facilitates implementing logical operations involving inverse data values (e.g., inverse operands and/or inverse result), among others. The control signals TT, TF, FT, and FF described in FIGS. 12 and 13 correspond to respective control signals FS1, FS3, FS2, and FS4 described in FIGS. 6, 7, and 8.

Similar to the logic tables illustrated in FIG. 10, Logic Table 13-1 illustrated in FIG. 13 shows the starting data value stored in the compute component 1231 shown in column A at 1344, and the starting data value stored in the sense amplifier 1206 shown in column B at 1345. The other 3 column headings in Logic Table 13-1 refer to the state of the pass gates 1207-1 and 1207-2 and the swap transistors 1242, which can respectively be controlled to be OPEN or CLOSED depending on the state of the four logic selection control signals (e.g., TF, TT, FT, and FF), in conjunction with a particular data value present on the pair of complementary sense lines 1205-1 and 1205-2 when the ISO control signal is asserted. The "NOT OPEN" column corresponds to the pass gates 1207-1 and 1207-2 and the swap transistors 1242 both being in a non-conducting condition, the "OPEN TRUE" column corresponds to the pass gates 1207-1 and 1207-2 being in a conducting condition, and the "OPEN INVERT" column corresponds to the swap transistors 1242 being in a conducting condition. The configuration corresponding to the pass gates 1207-1 and 1207-2 and the swap transistors 1242 both being in a conducting condition is not reflected in Logic Table 13-1 since this results in the sense lines being shorted together.

Via selective control of the pass gates 1207-1 and 1207-2 and the swap transistors 1242, each of the three columns of the upper portion of Logic Table 13-1 can be combined with each of the three columns of the lower portion of Logic Table 13-1 to provide nine (e.g., 3×3) different result combinations, corresponding to nine different logical operations, as indicated by the various connecting paths shown at 1375. The nine different selectable logical operations that can be implemented by the sensing circuitry 1250 are summarized in Logic Table 13-2.

The columns of Logic Table 13-2 show a heading 1380 that includes the states of logic selection control signals (e.g., FF, FT, TF, TT). For example, the state of a first logic selection control signal (e.g., FF) is provided in row 1376, the state of a second logic selection control signal (e.g., FT) is provided in row 1377, the state of a third logic selection control signal (e.g., TF) is provided in row 1378, and the state of a fourth logic selection control signal (e.g., TT) is provided in row 1379. The particular logical operation corresponding to the results is summarized in row 1347.

Figure 14:
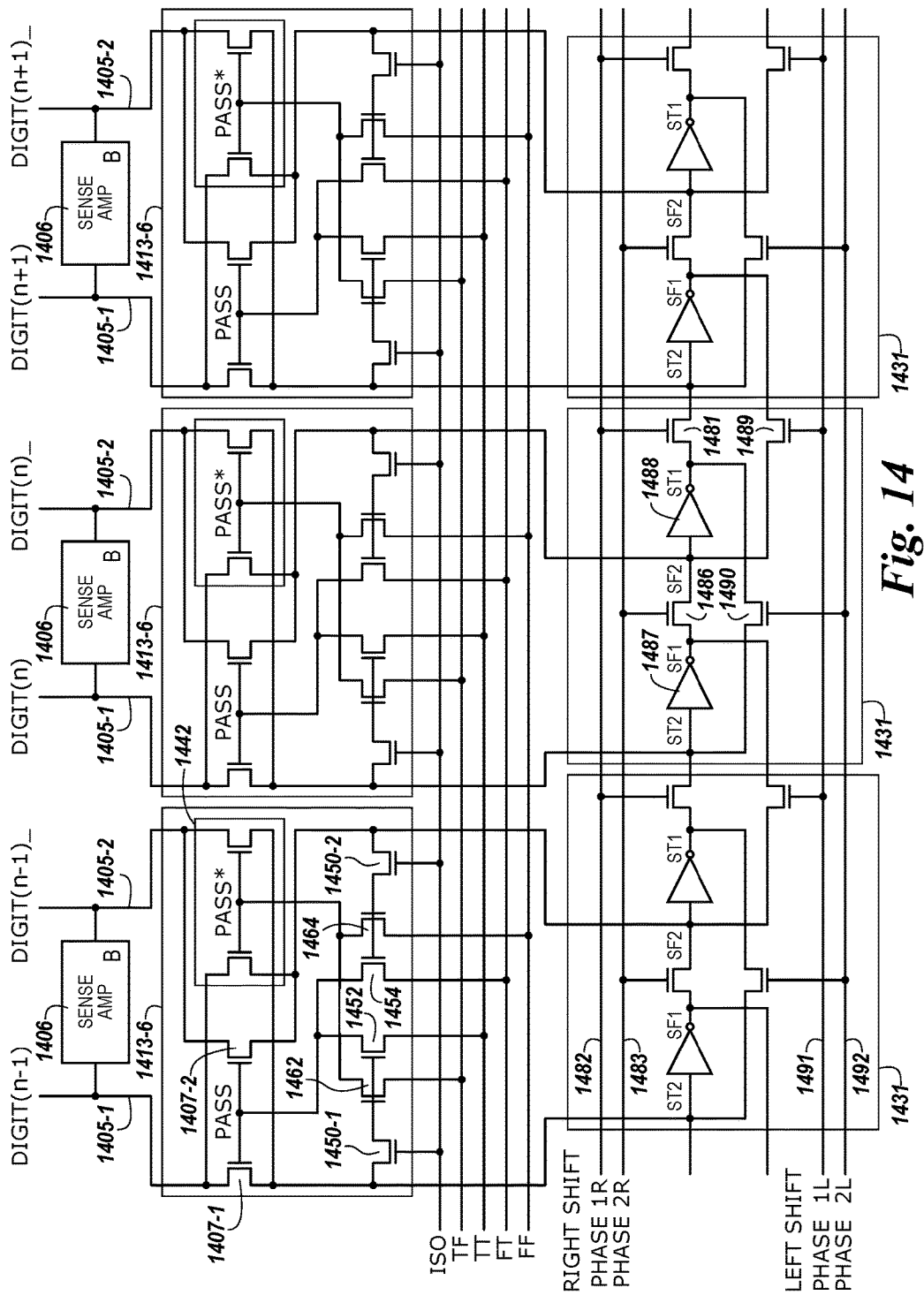
FIG. 14 is a schematic diagram illustrating sensing circuitry having selectable logical operation selection logic in accordance with a number of embodiments of the present disclosure.

FIG. 14 is a schematic diagram illustrating sensing circuitry having selectable logical operation selection logic in accordance with a number of embodiments of the present disclosure. FIG. 14 shows a number of sense amplifiers 1406 coupled to respective pairs of complementary sense lines 1405-1 and 1405-2, and a corresponding number of compute component 1431 coupled to the sense amplifiers 1406 via pass gates 1407-1 and 1407-2. The gates of the pass gates 1407-1 and 1407-2 can be controlled by a logical operation selection logic signal, PASS. For example, an output of the logical operation selection logic 1413-6 can be coupled to the gates of the pass gates 1407-1 and 1407-2.

According to the embodiment illustrated in FIG. 14, the compute components 1431 can comprise respective stages (e.g., shift cells) of a loadable shift register configured to shift data values left and right as described in detail with respect to FIG. 4A. For example, as illustrated in FIG. 14, each compute component 1431 (e.g., stage) of the shift register comprises a pair of right-shift transistors 1481 and 1486 (e.g., similar to respective right-shift transistors 481 and 486 shown in FIG. 3), a pair of left-shift transistors 1489 and 1490 (e.g., similar to respective left-shift transistors 489 and 490 shown in FIG. 4A), and a pair of inverters 1487 and 1488 (e.g., similar to respective inverters 387 and 388 shown in FIG. 3). The signals PHASE 1R, PHASE 2R, PHASE 1L, and PHASE 2L can be applied to respective control lines 1482, 1483, 1491 and 1492 to enable/disable feedback on the latches of the corresponding compute components 1431 in association with performing logical operations and/or shifting data in accordance with embodiments described herein. Examples of shifting data (e.g., from a particular compute component 1431 to an adjacent compute component 1431) is described further below with respect to FIGS. 16 and 17. The sensing circuitry illustrated in FIG. 14 is configured and operates similarly to the sensing circuitry illustrated in FIG. 12 with the exception of the compute components 1431 being configured as a loadable shift register.

Figure 16:
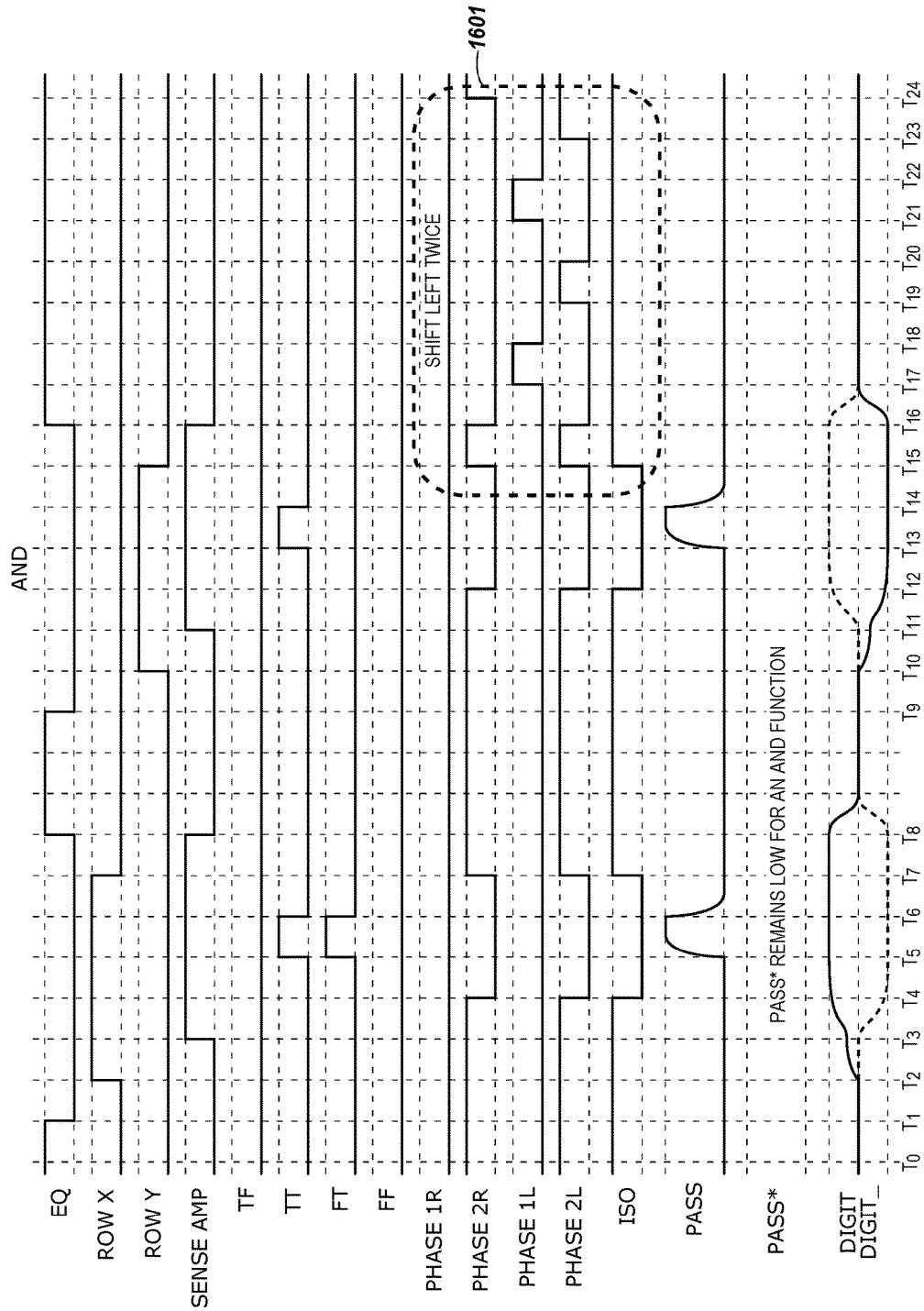
FIG. 16 illustrates a timing diagram associated with performing a logical operation and a shifting operation using the sensing circuitry in accordance with a number of embodiments of the present disclosure.
Figure 17:
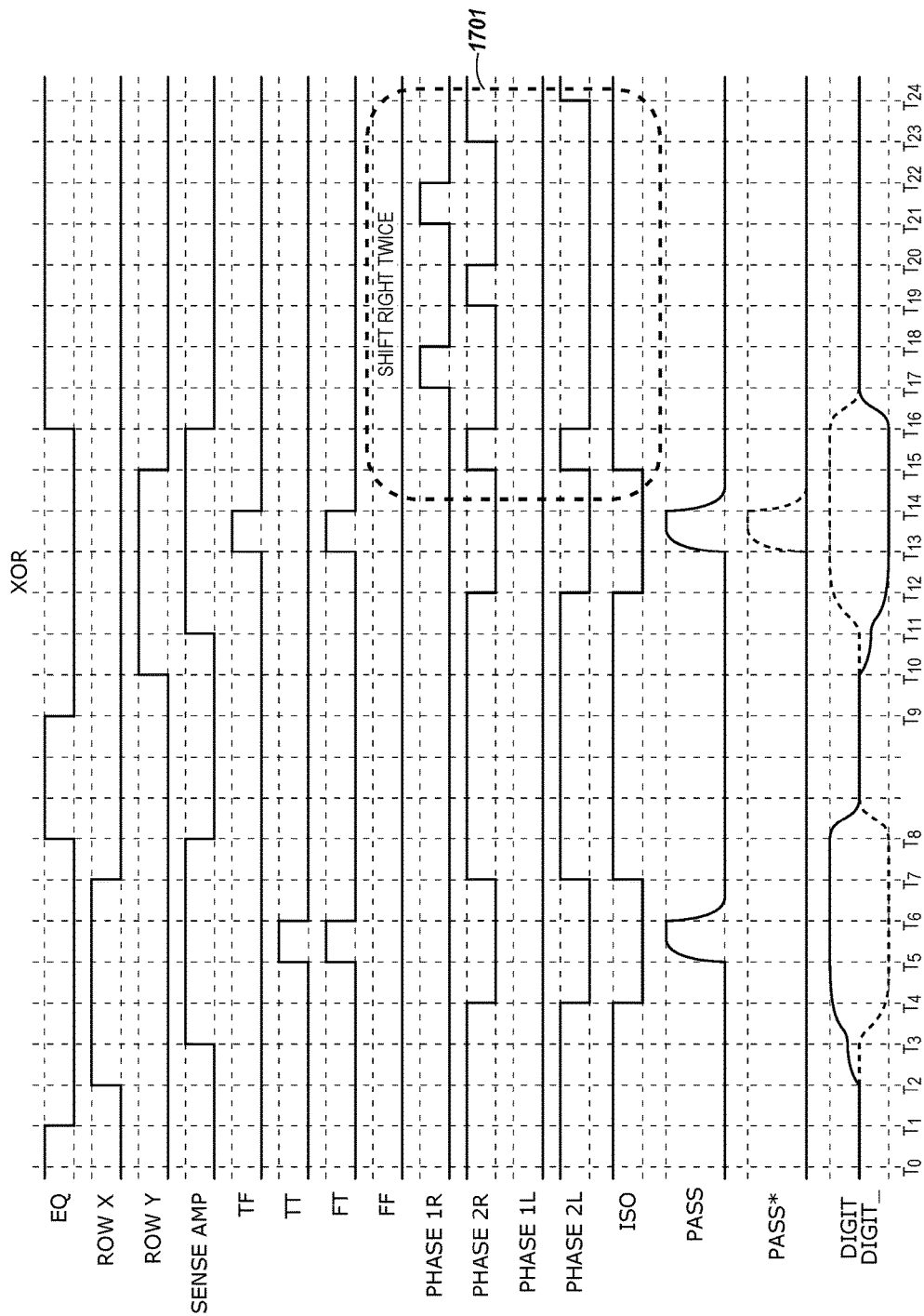
FIG. 17 illustrates a timing diagram associated with performing a logical operation and a shifting operation using the sensing circuitry in accordance with a number of embodiments of the present disclosure.

The logical operation selection logic 1413-6 includes the swap gates 1442, as well as logic to control the pass gates 1407-1 and 1407-2 and the swap gates 1442. The logical operation selection logic 1413-6 includes four logic selection transistors: logic selection transistor 1462 coupled between the gates of the swap transistors 1442 and a TF signal control line, logic selection transistor 1452 coupled between the gates of the pass gates 1407-1 and 1407-2 and a TT signal control line, logic selection transistor 1454 coupled between the gates of the pass gates 1407-1 and 1407-2 and a FT signal control line, and logic selection transistor 1464 coupled between the gates of the swap transistors 1442 and a FF signal control line. Gates of logic selection transistors 1462 and 1452 are coupled to the true sense line through isolation transistor 1450-1 (having a gate coupled to an ISO signal control line). Gates of logic selection transistors 1464 and 1454 are coupled to the complementary sense line through isolation transistor 1450-2 (also having a gate coupled to an ISO signal control line). FIGS. 16 and 17 illustrate timing diagrams associated with performing logical operations and shifting operations using the sensing circuitry shown in FIG. 14.

Figure 15:
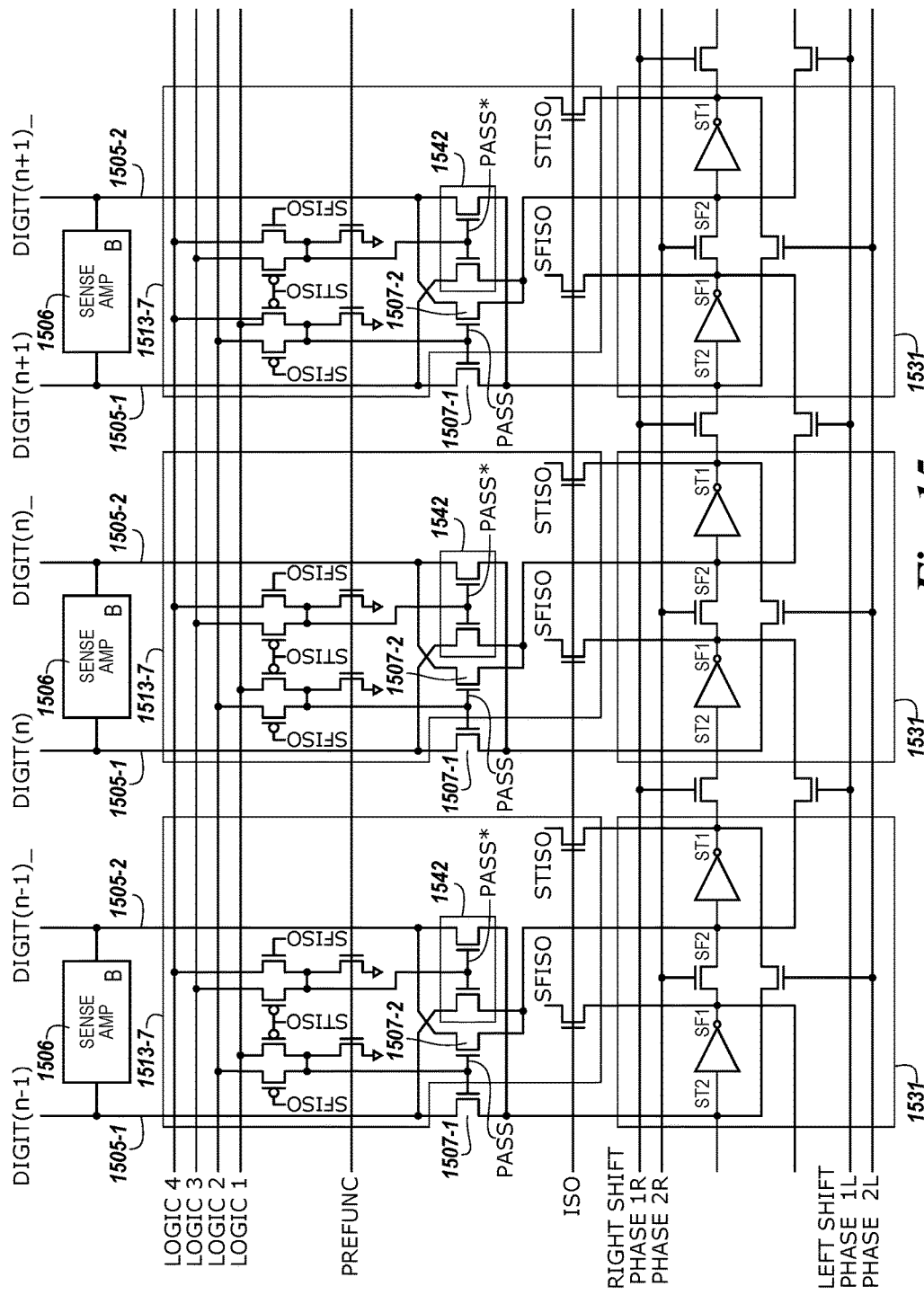
FIG. 15 is a schematic diagram illustrating sensing circuitry having selectable logical operation selection logic in accordance with a number of embodiments of the present disclosure.

FIG. 15 is a schematic diagram illustrating sensing circuitry having selectable logical operation selection logic in accordance with a number of embodiments of the present disclosure. FIG. 15 shows a number of sense amplifiers 1506 coupled to respective pairs of complementary sense lines 1505-1 and 1505-2, and corresponding compute components 1531 coupled to the respective sense amplifiers 1506 via pass gates 1507-1 and 1507-2. The compute components 1531 can comprise a loadable shift register configured to shift data values left and right as described in detail with respect to FIGS. 4A, 16, and 17.

The pass gates 1507-1 and 1507-2 can be controlled by a logical operation selection logic signal, PASS. The sensing circuitry shown in FIG. 15 also shows a logical operation selection logic 1513-7 coupled to a number of logic selection control input control lines, including LOGIC 1, LOGIC 2, LOGIC 3, LOGIC 4, SFISO, and STISO. Selection of a logical operation from a plurality of logical operations is determined from the condition of logic selection control signals on the logic selection control input control lines, as well as the data values present on the pair of complementary sense lines 1505-1 and 1505-2 when the isolation transistors are enabled via the ISO control signal being activated.

According to various embodiments, one isolation transistor is coupled between a control signal line communicating a SFISO control signal and the SF1 node of the loadable shift register of the compute component 1531. Another isolation transistor is coupled between a control signal line communicating a STISO control signal and the ST1 node of the loadable shift register of the compute component 1531. Gates of the isolation transistors are coupled to a control signal line communicating the ISO control signal. If the SFISO control signal is activated (e.g., high) when the ISO control signal is activated to OPEN the isolation transistors, a data value corresponding to the high SFISO control signal is loaded into the complement portion of the loadable shift register of the compute component 1531. If the STISO control signal is activated (e.g., high) when the ISO control signal is activated to OPEN the isolation transistors, a data value corresponding to the high STISO control signal is loaded into the true portion of the loadable shift register of an adjacent compute component 1531.

As has been described for previous sensing circuitry configurations, when the pass gates 1507-1 and 1507-2 are OPEN, data values on the pair of complementary sense lines 1505-1 and 1505-2 are passed to the compute component 1531 and thereby loaded into the loadable shift register. The data values on the pair of complementary sense lines 1505-1 and 1505-2 can be the data value stored in the sense amplifier 1506 when the sense amplifier is fired. The logical operation selection logic signal, PASS, is high to OPEN the pass gates 1507-1 and 1507-2, when logic selection control signal LOGIC 1 is activated and the SFISO control signal is not activated (e.g., is low, which turns on the p-channel logic selection transistor having a gate coupled to the SFiso control signal line. The logical operation selection logic signal, PASS, is also high to OPEN the pass gates 1507-1 and 1507-2, when logic selection control signal LOGIC 2 is activated and the STISO control signal is not activated (e.g., is low, which turns on the p-channel logic selection transistor having a gate coupled to the STISO control signal line.

Similar logic is shown in FIG. 15 coupled to the PASS* logical operation selection logic signal, which is high to OPEN the swap gates 1542. The logic shown in FIG. 15 coupled to the PASS* logical operation selection logic signal mirrors the logic configuration coupled to the PASS logical operation selection logic signal. FIG. 15 shows swap transistors 1542 configured to swap the orientation of the pair of complementary sense lines 1505-1 and 1505-2 between the sense amplifier 1506 and the compute component 1531 (in a similar manner as previously described with respect to the configuration of swap transistor 1242 illustrated in FIG. 12). When the swap transistors 1542 are OPEN, data values on the pair of complementary sense lines 1505-1 and 1505-2 on the sense amplifier 1506 side of the swap transistors 1542 are oppositely-coupled to the pair of complementary sense lines 1505-1 and 1505-2 on the compute component 1531 side of the swap transistors 1542, and thereby loaded into the loadable shift register of the compute component 1531.

The logical operation selection logic signal PASS* is activated (e.g., high) to OPEN the swap transistors 1542 when logic selection control signal LOGIC 3 is activated and the STISO control signal is not activated (e.g., is low, which turns on the p-channel logic selection transistor having a gate coupled to the STISO control signal line). The logical operation selection logic signal PASS* is also high to OPEN the swap transistors 1542 when logic selection control signal LOGIC 4 is activated and the SFISO control signal is not activated (e.g., is low, which turns on the p-channel logic selection transistor having a gate coupled to the SFiso control signal line.

The gates of the swap transistors 1542 can also be selectably grounded to ensure the swap transistors 1542 are CLOSED via a transistor having a gate coupled to the PREFUNC control signal line and arranged to couple the logic signal PASS* to a reference potential. According to the configuration shown in FIG. 15, activation of the PREFUNC control signal line causes the pass gates 1507-1 and 1507-2 and the swap transistors 1542 to be CLOSED (e.g., non-conducting). The PREFUNC control signal can be activated, for example, during loadable shift register shift left/right operations.

The LOGIC 1, LOGIC 2, LOGIC 3, LOGIC 4, SFISO, and STISO control signals can operate to select a logical function to implement based on the data value ("B") in the sense amplifier 1506 and the data value ("A") in the compute component 1531 in a different manner than the TF, TT, FT, and FF control signals described with respect to FIGS. 12 and 14. In particular, the LOGIC 1, LOGIC 2, LOGIC 3, LOGIC 4, SFISO, and STISO control signals are configured to select the logical function to implement independent from the data value present on the pair of complementary sense lines 1505-1 and 1505-2 (although the result of the implemented logical operation can be dependent on the data value present on the pair of complementary sense lines 1505-1 and 1505-2. For example, the LOGIC 1, LOGIC 2, LOGIC 3, LOGIC 4, SFISO, and STISO control signals select the logical operation to implement directly since the data value present on the pair of complementary sense lines 1505-1 and 1505-2 is not passed through logic to operate the gates of the pass gates 1507-1 and 1507-2.

The sensing circuitry illustrated in FIG. 15 is configured to select one of a plurality of logical operations to implement directly from the four logic selection control signals (e.g., logical operation selection is not dependent on the data value present on the pair of complementary sense lines). As was described with respect to FIG. 12, some combinations of the logic selection control signals can cause both the pass gates 1507-1 and 1507-2 and swap transistors 1542 to be OPEN at the same time, which shorts the pair of complementary sense lines 1505-1 and 1505-2 together. According to a number of embodiments of the present disclosure, the logical operations which can be implemented by the sensing circuitry illustrated in FIG. 15 can be the logical operations summarized in the logic tables shown in FIG. 13.

FIG. 16 illustrates a timing diagram associated with performing a logical AND operation and a shifting operation using the sensing circuitry in accordance with a number of embodiments of the present disclosure. FIG. 16 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2). The ROW X and ROW Y signals correspond to signals applied to respective access line (e.g., access lines 204-X and 204-Y shown in FIG. 2) to access a selected cell (or row of cells). The SENSE AMP signal corresponds to a signal used to enable/disable a sense amplifier (e.g., sense amplifier 1406). The TF, TT, FT, and FF signals correspond to logic selection control signals such as those shown in FIGS. 12 and 14 (e.g., signals coupled to logic selection transistors 1262/1462, 1252/1452, 1254/1454, and 1264/1464). The PHASE 1R, PHASE 2R, PHASE 1L, and PHASE 2L signals correspond to the control signals (e.g., clock signals) provided to respective control lines 1482, 1483, 1491 and 1492 shown in FIG. 14. The ISO signal corresponds to the signal coupled to the gates of the isolation transistors 1450-1 and 1450-2 shown in FIG. 14. The PASS signal corresponds to the signal coupled to the gates of pass transistors 1407-1 and 1407-2 shown in FIG. 14, and the PASS* signal corresponds to the signal coupled to the gates of the swap transistors 1442. The DIGIT and DIGIT_signals correspond to the signals present on the respective sense lines 1405-1 (e.g., DIGIT (n)) and 1405-2 (e.g., DIGIT (n)_).

The timing diagram shown in FIG. 16 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 16, reference will be made to the sensing circuitry described in FIG. 14. For example, the logical operation described in FIG. 16 can include storing the data value of the ROW X memory cell (e.g., the "ROW X data value) in the latch of the corresponding compute component 1431 (e.g., the "A" data value), which can be referred to as the accumulator 1431, storing the data value of the ROW Y memory cell (e.g., the "ROW Y data value") in the latch of the corresponding sense amplifier 1406 (e.g., the "B" data value), and performing a selected logical operation (e.g., a logical AND operation in this example) on the ROW X data value and the ROW Y data value, with the result of the selected logical operation being stored in the latch of the compute component 1431.

As shown in FIG. 16, at time $T_1$, equilibration of the sense amplifier 1406 is disabled (e.g., EQ goes low). At time $T_2$, ROW X goes high to access (e.g., select) the ROW X memory cell. At time $T_3$, the sense amplifier 1406 is enabled (e.g., SENSE AMP goes high), which drives the complementary sense lines 1405-1 and 1405-2 to the appropriate rail voltages (e.g., $V_{DD}$ and GND) responsive to the ROW X data value (e.g., as shown by the DIGIT and DIGIT_ signals), and the ROW X data value is latched in the sense amplifier 1406. At time $T_4$, the PHASE 2R and PHASE 2L signals go low, which disables feedback on the latch of the compute component 1431 (e.g., by turning off transistors 1486 and 1490, respectively) such that the value stored in the compute component may be overwritten during the logical operation. Also, at time $T_4$, ISO goes low, which disables isolation transistors 1450-1 and 1450-2. At time $T_5$, TT and FT are enabled (e.g., go high), which results in PASS going high (e.g., since either transistor 1452 or 1454 will conduct depending on which of node ST2 (corresponding to node "S" in FIG. 12) or node SF2 (corresponding to node "S*" in FIG. 12) was high when ISO was disabled at time $T_4$ (recall that when ISO is disabled, the voltages of the nodes ST2 and SF2 reside dynamically on the gates of the respective enable transistors 1452 and 1454). PASS going high enables the pass transistors 1407-1 and 1407-2 such that the DIGIT and DIGIT_signals, which correspond to the ROW X data value, are provided to the respective compute component nodes ST2 and SF2. At time $T_6$, TT and FT are disabled, which results in PASS going low, which disables the pass transistors 1407-1 and 1407-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 1431 such that the ROW X data value is latched therein. Enabling ISO at time $T_7$ again couples nodes ST2 and SF2 to the gates of the enable transistors 1452, 1454, 1462, and 1464. At time $T_8$, equilibration is enabled (e.g., EQ goes high such that DIGIT and DIGIT_are driven to an equilibrate voltage such as $V_{DD}/2$) and the sense amplifier 1406 is disabled (e.g., SENSE AMP goes low).

With the ROW X data value latched in the compute component 1431, equilibration is disabled (e.g., EQ goes low at time $T_9$). At time $T_{10}$, ROW Y goes high to access (e.g., select) the ROW Y memory cell. At time $T_{11}$, the sense amplifier 1406 is enabled (e.g., SENSE AMP goes high), which drives the complementary sense lines 1405-1 and 1405-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 1406. At time $T_{12}$, the PHASE 2R and PHASE 2L signals go low, which disables feedback on the latch of the compute component 1431 (e.g., by turning off transistors 1486 and 1490, respectively) such that the value stored in the compute component may be overwritten during the logical operation. Also, at time $T_{12}$, ISO goes low, which disables isolation transistors 1450-1 and 1450-2. Since the desired logical operation in this example is an AND operation, at time $T_{13}$, TT is enabled while TF, FT and FF remain disabled (as shown in TABLE 13-2, FF=0, FT=0, TF=0, and TT=1 corresponds to a logical AND operation). Whether enabling TT results in PASS going high depends on the value stored in the compute component 1431 when ISO is disabled at time $T_{12}$. For example, enable transistor 1452 will conduct if node ST2 was high when ISO is disabled, and enable transistor will not conduct if node ST2 was low when ISO was disabled at time $T_{12}$.

In this example, if PASS goes high at time $T_{13}$, the pass transistors 1407-1 and 1407-2 are enabled such that the DIGIT and DIGIT_signals, which correspond to the ROW Y data value, are provided to the respective compute component nodes ST2 and SF2. As such, the value stored in the compute component 1431 (e.g., the ROW X data value) may be flipped, depending on the value of DIGIT and DIGIT_ (e.g., the ROW Y data value). In this example, if PASS stays low at time $T_{13}$, the pass transistors 1407-1 and 1407-2 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same.

At time $T_{14}$, TT is disabled, which results in PASS going (or remaining) low, such that the pass transistors 1407-1 and 1407-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 1431 such that the result of the AND operation (e.g., "A" AND "B") is latched therein. Enabling ISO at time $T_{15}$ again couples nodes ST2 and SF2 to the gates of the enable transistors 1452, 1454, 1462, and 1464. At time $T_{16}$, equilibration is enabled (e.g., EQ goes high such that DIGIT and DIGIT_are driven to an equilibrate voltage) and the sense amplifier 1406 is disabled (e.g., SENSE AMP goes low).

The result of the AND operation, which is initially stored in the compute component 1431 in this example, can be transferred back to the memory array (e.g., to a memory cell coupled to ROW X, ROW Y, and/or a different row via the complementary sense lines) and/or to an external location (e.g., an external processing component) via I/O lines.

FIG. 16 also includes (e.g., at 1601) signaling associated with shifting data (e.g., from a compute component 1431 to an adjacent compute component 1431). The example shown in FIG. 16 illustrates two left shifts such that a data value stored in a compute component corresponding to column "N" is shifted left to a compute component corresponding to column "N–2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 1489 to conduct, which causes the data value at node SF1 to move left to node SF2 of a left-adjacent compute component 1431. PHASE 2L is subsequently enabled at time $T_{19}$ and disabled at time Tao. Enabling PHASE 2L causes transistor 1490 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

FIG. 17 illustrates a timing diagram associated with performing a logical XOR operation and a shifting operation using the sensing circuitry in accordance with a number of embodiments of the present disclosure. FIG. 17 includes the same waveforms described in FIG. 16 above. However, the timing diagram shown in FIG. 17 is associated with performing a logical XOR operation on a ROW X data value and a ROW Y data value (e.g., as opposed to a logical AND operation). Reference will again be made to the sensing circuitry described in FIG. 14.

The signaling indicated at times $T_0$ through $T_9$ for FIG. 17 are the same as for FIG. 16 and will not be repeated here. As such, at time $T_9$, EQ is disabled with the ROW X data value being latched in the compute component 1431. At time $T_{10}$, ROW Y goes high to access (e.g., select) the ROW Y memory cell. At time $T_{11}$, the sense amplifier 1406 is enabled (e.g., SENSE AMP goes high), which drives the complementary sense lines 1405-1 and 1405-2 to the appropriate rail voltages (e.g., $V_{DD}$ and GND) responsive to the ROW Y data value (e.g., as shown by the DIGIT and DIGIT_signals), and the ROW Y data value is latched in the sense amplifier 1406. At time $T_{12}$, the PHASE 2R and PHASE 2L signals go low, which disables feedback on the latch of the compute component 1431 (e.g., by turning off transistors 1486 and 1490, respectively) such that the value stored in the compute component 1431 may be overwritten during the logical operation. Also, at time $T_{12}$, ISO goes low, which disables isolation transistors 1450-1 and 1450-2. Since the desired logical operation in this example is an XOR operation, at time $T_{13}$, TF and FT are enabled while TT and FF remain disabled (as shown in TABLE 13-2, FF=0, FT=1, TF=1, and TT=0 corresponds to a logical XOR (e.g., "AXB") operation). Whether enabling TF and FT results in PASS or PASS* going high depends on the value stored in the compute component 1431 when ISO is disabled at time $T_{12}$. For example, enable transistor 1462 will conduct if node ST2 was high when ISO is disabled, and enable transistor 1462 will not conduct if node ST2 was low when ISO was disabled at time $T_{12}$. Similarly, enable transistor 1454 will conduct if node SF2 was high when ISO is disabled, and enable transistor 1454 will not conduct if node SF2 was low when ISO is disabled.

In this example, if PASS goes high at time $T_{13}$, the pass transistors 1407-1 and 1407-2 are enabled such that the DIGIT and DIGIT_signals, which correspond to the ROW Y data value, are provided to the respective compute component nodes ST2 and SF2. As such, the value stored in the compute component 1431 (e.g., the ROW X data value) may be flipped, depending on the value of DIGIT and DIGIT_ (e.g., the ROW Y data value). In this example, if PASS stays low at time $T_{13}$, the pass transistors 1407-1 and 1407-2 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same. In this example, if PASS* goes high at time $T_{13}$, the swap transistors 1442 are enabled such that the DIGIT and DIGIT_signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_would be provided to node ST2). As such, the value stored in the compute component 1431 (e.g., the ROW X data value) may be flipped, depending on the value of DIGIT and DIGIT_(e.g., the ROW Y data value). In this example, if PASS* stays low at time $T_{13}$, the swap transistors 1442 are not enabled such that the DIGIT and DIGIT_signals, which correspond to the ROW Y data value, remain isolated from the nodes ST2 and SF2 of the compute component 1431. As such, the data value in the compute component (e.g., the ROW X data value) would remain the same.

At time $T_{14}$, TF and FT are disabled, which results in PASS and PASS* going (or remaining) low, such that the pass transistors 1407-1 and 1407-2 and swap transistors 1442 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 1431 such that the result of the XOR operation (e.g., "A" XOR "B") is latched therein. Enabling ISO at time $T_{15}$ again couples nodes ST2 and SF2 to the gates of the enable transistors 1452, 1454, 1462, and 1464. At time $T_{16}$, equilibration is enabled (e.g., EQ goes high such that DIGIT and DIGIT_are driven to an equilibrate voltage) and the sense amplifier 1406 is disabled (e.g., SENSE AMP goes low).

The result of the XOR operation, which is initially stored in the compute component 1431 in this example, can be transferred back to the memory array (e.g., to a memory cell coupled to ROW X, ROW Y, and/or a different row via the complementary sense lines) and/or to an external location (e.g., an external processing component) via I/O lines.

FIG. 17 also includes (e.g., at 1701) signaling associated with shifting data (e.g., from a compute component 1431 to an adjacent compute component 1431). The example shown in FIG. 17 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 1481 to conduct, which causes the data value at node ST1 to move right to node ST2 of a right-adjacent compute component 1431. PHASE 2R is subsequently enabled at time $T_{19}$ and disabled at time Tao. Enabling PHASE 2R causes transistor 1486 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 16 and 17 include the logical operation result being stored in the compute component (e.g., 1431), sensing circuitry in accordance with embodiments described herein can be operated to perform logical operations with the result being initially stored in the sense amplifier (e.g., as illustrated in FIG. 8). Also, embodiments are not limited to the "AND" and "XOR" logical operation examples described in FIGS. 16 and 17, respectively. For example, sensing circuitry in accordance with embodiments of the present disclosure (e.g., 1450 shown in FIG. 14) can be controlled to perform various other logical operations such as those shown in Table 13-2.

Figure 18:
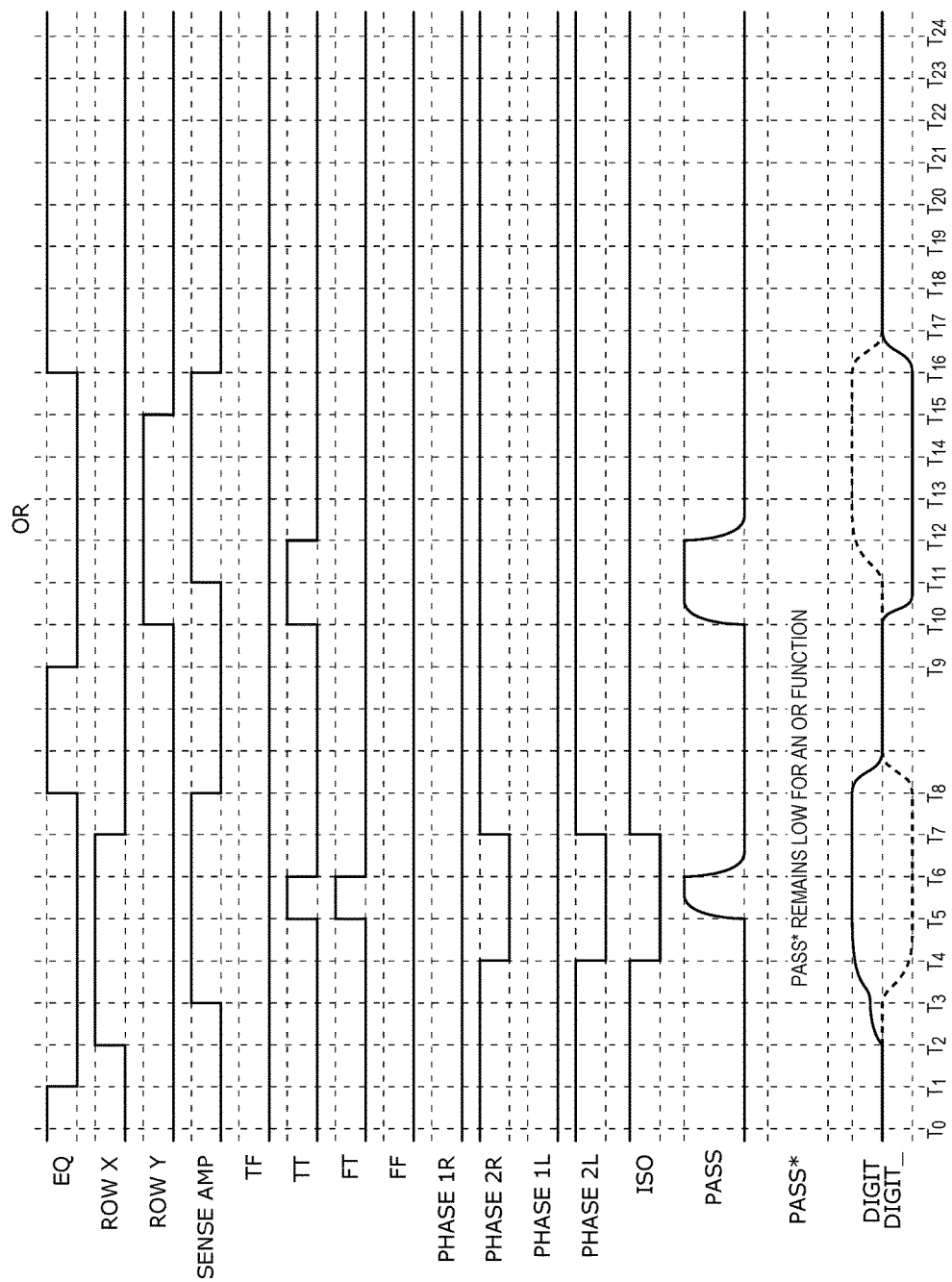
FIG. 18 illustrates a timing diagram associated with performing a logical OR operation using the sensing circuitry in accordance with a number of embodiments of the present disclosure.

FIG. 18 illustrates a timing diagram associated with performing a logical OR operation using the sensing circuitry in accordance with a number of embodiments of the present disclosure. FIG. 18 includes the same waveforms described in FIGS. 16 and 17 above. However, the timing diagram shown in FIG. 18 is associated with performing a logical OR operation on a ROW X data value and a ROW Y data value with the result being initially stored in the sense amplifier (e.g., as opposed to the result of logical AND operation being initially stored in the compute component, as described in FIG. 16). Also, FIG. 18 does not include signals associated with shifting data as illustrated in FIGS. 16 and 17. Reference will again be made to the sensing circuitry described in FIG. 14.

The signaling indicated at times $T_0$ through $T_9$ for FIG. 18 are the same as for FIG. 16 and will not be repeated here. As such, at time $T_9$, EQ is disabled with the ROW X data value being latched in the compute component 1431. At time $T_{10}$, ROW Y goes high to access (e.g., select) the ROW Y memory cell, which puts a relatively small differential voltage on sense lines 1405-1 and 1405-2. Also at time $T_{10}$, since the desired logical operation in this example is an OR operation, TT (e.g., FS1) is enabled (e.g., before the sense amp is enabled at time $T_{11}$) while TF (e.g., FS3), FT (e.g., FS2) and FF (e.g., FS4) remain disabled (as shown in the table shown in FIG. 8), since FF=0, FT=0, TF=0, and TT=1 corresponds to a logical OR operation.

Whether enabling TT results in PASS going high depends on the value stored in the compute component 1431. For example, enable transistor 1452 will conduct if node ST2 is high and ISO is enabled, and enable transistor 1452 will not conduct if node ST2 is low and ISO is enabled (e.g., at time $T_{10}$). At time $T_{11}$, the sense amplifier 1406 is enabled, and at time $T_{12}$, the TT control signal is disabled. Unlike the AND example described in FIG. 16, in which the ISO, PHASE 2R, and PHASE 2L signals were disabled while the control signal TT was enabled, in this example, the ISO, PHASE 2R, and PHASE 2L signals remain disabled while the control signal TT is enabled (e.g., such that feedback on the compute component latch is enabled and such that isolation transistors 1450-1 and 1450-2 remain enabled after time $T_7$).

In this example, if PASS goes high at time $T_{10}$ (e.g., the compute component 1431 stores a "1" with node ST2 being high and node SF2 being low), the pass transistors 1407-1 and 1407-2 are enabled such that the voltages on ST2 and SF2 are presented to the sense amplifier 1406 via sense lines 1405-1 and 1405-2, respectively. The relatively larger voltage difference between nodes ST2 and SF2 overpowers the smaller differential voltage present on sense lines 1405-1 and 1405-2 due to the data value of the ROW Y memory cell (e.g., regardless of the ROW Y data value). As such, when the sense amplifier 1406 is enabled at time $T_{11}$, the data value stored in the compute component 1431 (e.g., the ROW X data value) is latched in the sense amplifier 1406 (e.g., regardless of the ROW Y data value). In this example, if PASS stays low at time $T_{13}$, (e.g., the compute component 1431 stores a "0" with node ST2 being low and node SF2 being high), the pass transistors 1407-1 and 1407-2 are not enabled such that the voltages on ST2 and SF2 are not presented to the sense amplifier 1406 via sense lines 1405-1 and 1405-2, respectively. As such, when the sense amplifier 1406 is enabled at time $T_{11}$, the data value stored in the ROW Y memory cell is latched in the sense amplifier 1406 (e.g., regardless of the ROW X data value). Therefore, in the example described in FIG. 18, after the sense amplifier 1406 is enabled, which occurs after the selected control signal TT is enabled, the result of the OR operation (e.g., the result of ROW X OR ROW Y) is stored in the sense amplifier 1406.

The result of the OR operation, which is initially stored in the sense amplifier 1406 in this example, can be transferred back to the memory array (e.g., to a memory cell coupled to ROW X, ROW Y, and/or a different row via the complementary sense lines), and/or to the compute component 1431, and/or to an external location (e.g., an external processing component) via I/O lines.

While example embodiments including various combinations and configurations of sensing circuitry, sense amps, compute components, dynamic latches, isolation devices, and/or shift circuitry have been illustrated and described herein, embodiments of the present disclosure are not limited to those combinations explicitly recited herein. Other combinations and configurations of the sensing circuitry, sense amps, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a host configured to generate instructions; and
   a memory device coupled to the host and comprising:
      an array of memory cells coupled to sensing circuitry comprising a sense amplifier latch and a compute component latch; and
      control circuitry configured to execute instructions from the host by causing logical operations to be performed on operands stored in memory cells corresponding to a same column of the array and coupled to different access lines of the array by:
         providing, to logical operation selection logic coupled to the sense amplifier latch and to the compute component latch, a particular combination of logical operation selection signals corresponding to a selected logical operation to be performed on the operands; and
   wherein the selected logical operation comprises one from among a group of selectable logical operations corresponding to different respective logical selection signal combinations, the group including an exclusive OR (XOR) logical operation; and
   wherein the logical operation selection logic comprises:
      a first pair of transistors having their gates commonly coupled to a first digit line through a first isolation transistor; and
      a second pair of transistors having their gates commonly coupled to a second digit line through a second isolation transistor;
      wherein a source/drain region of the first pair of transistors are configured to receive respective logical operation selection control signals, and wherein a source/drain region of the second pair of transistors are configured to receive different respective logical operation selection control signals.

2. The system of claim 1, wherein the host comprises a processing resource configured to generate the instructions.

3. The system of claim 2, wherein the processing resource comprises a host processor.

4. The system of claim 2, wherein the processing resource comprises a controller.

5. The system of claim 1, wherein the control circuitry comprises a state machine.

6. The system of claim 1, wherein the control circuitry comprises a sequencer.

7. The system of claim 1, wherein the control circuitry is configured to cause the selected logical operation to be performed without activating a column decode signal corresponding to the same column of the array.

8. The system of claim 1, wherein the host comprises a processor, and wherein the processor is on a separate integrated circuit from an integrated circuit on which the memory device is located.

9. The system of claim 1, wherein the host and the memory device are on a same integrated circuit.

10. The system of claim 1, wherein the host comprises a processing resource configured to perform logical operations in addition to those logical operations performed on the memory device.

11. The system of claim 1, further comprising a control bus configured to provide signals from the host to be decoded by the control circuitry.

12. The system of claim 1, wherein the operands on which the selected logical operation is performed include:
   a first data value stored in a first memory cell coupled to a first access line of the array; and
   a second data value stored in a second memory cell coupled to a second access line of the array; and
   wherein the control circuitry configured to cause performance of the selected logical operation by:
      activating the first access line a single time; and
      activating the second access line a single time.

13. The system of claim 1, wherein the group of selectable logical operations further includes an XNOR logical operation, a sense amplifier clear logical operation, and a sense amplifier set logical operation.

14. A system, comprising:
a host configured to generate instructions; and
a memory device coupled to the host and comprising:
an array of memory cells coupled to sensing circuitry comprising a plurality of sense amplifier latches and a respective plurality of compute component latches corresponding thereto on a per column basis; and
control circuitry configured to execute instructions from the host by causing logical operations to be performed, in parallel, on operands stored in memory cells corresponding to a same column of the array and coupled to different access lines of the array by:
providing, to logical operation selection logic, a particular combination of logical operation selection signals corresponding to a selected logical operation to be performed on the operands corresponding to the respective same columns;
wherein the selected logical operation comprises one from among a group of selectable logical operations corresponding to different respective logical selection signal combinations, the group including an exclusive OR (XOR) logical operation, an XNOR logical operation, a sense amplifier reset operation, and a sense amplifier set operation;
wherein the logical operation selection logic comprises a plurality of groups of transistors, with each group being coupled to the compute component latch and the sense amplifier latch of one of the respective columns; and
wherein each group of the plurality of groups of transistors of the logical operation selection logic comprises:
a first pair of transistors having their gates commonly coupled to a first digit line through a first isolation transistor; and
a second pair of transistors having their gates commonly coupled to a second digit line through a second isolation transistor;
wherein a source/drain region of the first pair of transistors are configured to receive respective logical operation selection control signals, and wherein a source/drain region of the second pair of transistors are configured to receive different respective logical operation selection control signals.

15. The system of claim 14, wherein the memory device comprises a processor-in-memory device coupled to the host via a bus, and wherein the host comprises a processor configured to perform logical operations in addition to logical operations performed on the memory device.

16. A method, comprising:
generating instructions on a host coupled to a memory device comprising an array of memory cells coupled to sensing circuitry comprising a sense amplifier latch and a compute component latch; and
executing the instructions using control circuitry of the memory device, wherein executing the instructions comprises causing performance of logical operations on operands stored in memory cells corresponding to a same column of the array and coupled to different access lines of the array by:
providing, to logical operation selection logic coupled to the sense amplifier latch and to the compute component latch, a particular combination of logical operation selection signals corresponding to a selected logical operation to be performed on the operands;
wherein the selected logical operation comprises one from among a group of selectable logical operations corresponding to different respective logical selection signal combinations, the group including an exclusive OR (XOR) logical operation;
wherein the operands on which the selected logical operation is performed include:
a first data value stored in a first memory cell coupled to a first access line of the array; and
a second data value stored in a second memory cell coupled to a second access line of the array; and
wherein performing the selected logical operation includes:
enabling the sense amplifier latch, a first time, while the first access line is activated;
subsequently disabling the sense amplifier latch; and
subsequently enabling the sense amplifier latch, a second time, while the second access line is activated.

17. The method of claim 16, further comprising providing the instructions from the host to the control circuitry via a control bus.

18. The method of claim 16,
wherein the control circuitry is configured to cause performance of the selected logical operation by:
activating the first access line a single time; and
activating the second access line a single time.

19. The method of claim 16, wherein performing the selected logical operation further includes enabling the particular combination of logical operation selection signals corresponding to the selected logical operation while the sense amplifier is enabled the second time.

* * * * *